United States Patent
Yoshida et al.

(10) Patent No.: US 11,245,010 B2
(45) Date of Patent: Feb. 8, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Kosuke Yoshida, Matsumoto (JP); Haruo Nakazawa, Matsumoto (JP); Kenichi Iguchi, Matsumoto (JP); Koh Yoshikawa, Matsumoto (JP); Motoyoshi Kubouchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/011,788

(22) Filed: Sep. 3, 2020

(65) Prior Publication Data

US 2021/0111248 A1    Apr. 15, 2021

(30) Foreign Application Priority Data

Oct. 11, 2019   (JP) .............................. JP2019-187499

(51) Int. Cl.
*H01L 29/10*    (2006.01)
*H01L 29/739*   (2006.01)
(Continued)

(52) U.S. Cl.
CPC ...... *H01L 29/105* (2013.01); *H01L 29/66348* (2013.01); *H01L 29/7397* (2013.01);
(Continued)

(58) Field of Classification Search
CPC ............. H01L 29/105; H01L 29/66348; H01L 29/7397; H01L 29/7813; H01L 29/0619; H01L 21/2253; H01L 21/26513
(Continued)

(56) References Cited

U.S. PATENT DOCUMENTS

2013/0134478 A1   5/2013  Nakajima et al.
2016/0141399 A1*  5/2016  Jelinek .................... H01L 22/20
                                                           257/139

(Continued)

FOREIGN PATENT DOCUMENTS

JP        2013102111 A    5/2013

*Primary Examiner* — Igwe U Anya
(74) *Attorney, Agent, or Firm* — Rabin & Berdo, P.C.

(57) ABSTRACT

A semiconductor device having a semiconductor substrate that includes a first-conductivity-type substrate and a first-conductivity-type epitaxial layer, and a plurality of trenches reaching a predetermined depth from a main surface of the semiconductor substrate to terminate in the first-conductivity-type epitaxial layer. The semiconductor substrate includes a hydrogen-donor introduced part, of which a concentration of a hydrogen donor is greatest at a depth position that is separate from bottoms of the trenches by a distance at least two times of the depth of the trenches. The impurity concentration of an impurity dopant of the first-conductivity-type substrate being lower than that of the first-conductivity-type epitaxial layer. A difference between a first resistivity, corresponding to a total impurity concentration of the impurity dopant and the hydrogen donor of the first-conductivity-type substrate, and a second resistivity, corresponding to the impurity concentration of the impurity dopant of the first-conductivity-type epitaxial layer, is at most 20%.

8 Claims, 19 Drawing Sheets

(51) Int. Cl.
    *H01L 29/66*     (2006.01)
    *H01L 29/78*     (2006.01)
    *H01L 21/225*     (2006.01)
    *H01L 29/06*     (2006.01)
    *H01L 21/265*     (2006.01)

(52) U.S. Cl.
    CPC ...... *H01L 29/7813* (2013.01); *H01L 21/2253* (2013.01); *H01L 21/26513* (2013.01); *H01L 29/0619* (2013.01)

(58) Field of Classification Search
    USPC .......................................................... 257/139
    See application file for complete search history.

(56) References Cited

U.S. PATENT DOCUMENTS

2016/0284825 A1*   9/2016   Onozawa ............ H01L 29/1095
2018/0122895 A1     5/2018   Jelinek et al.

\* cited by examiner

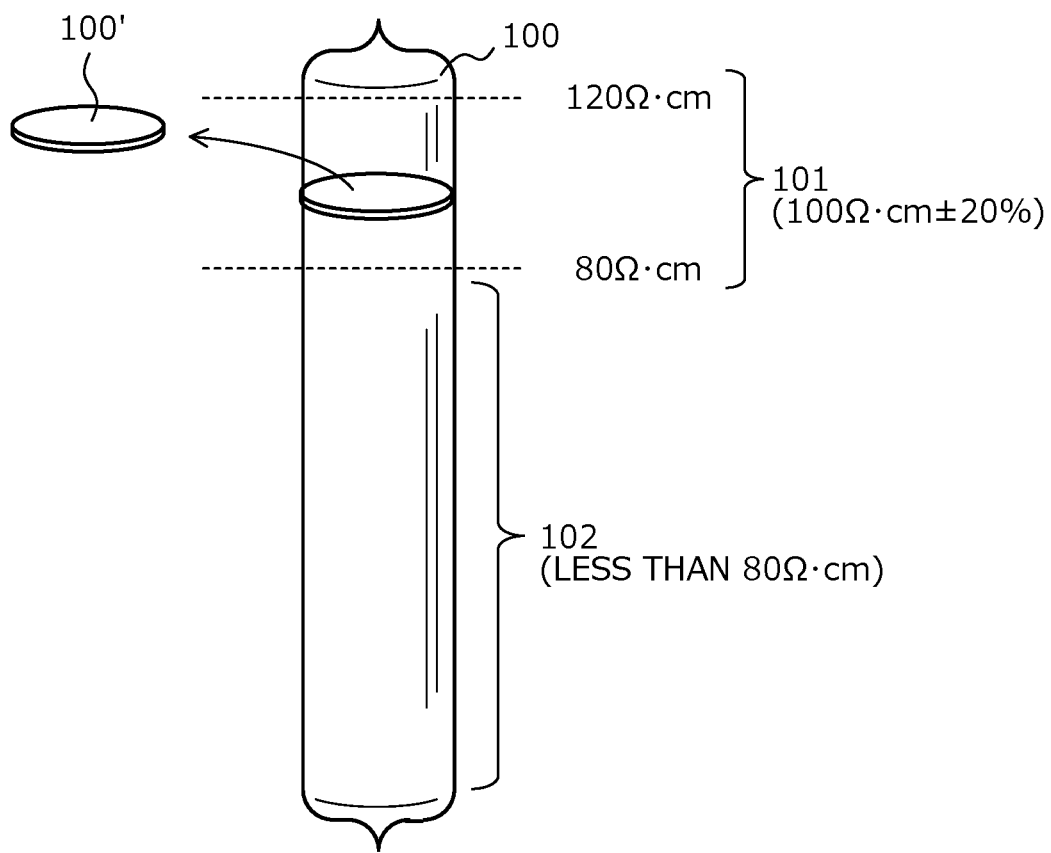

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2019-187499, filed on Oct. 11, 2019, the entire contents of which are incorporated herein by reference.

BACKGROUND OF THE INVENTION

1. Field of the Invention

Embodiments of the invention relate to a semiconductor device and method of manufacturing a semiconductor device.

2. Description of the Related Art

Conventionally, in an insulated gate bipolar transistor (IGBT), a semiconductor wafer (hereinafter, MCZ wafer) sliced from a single crystal silicon (Si) ingot (hereinafter, MCZ ingot) fabricated by a magnetic Czochralski method (MCZ) is prepared mainly as an $n^-$-type starting substrate for growing an $n^-$-type epitaxial layer. The $n^-$-type starting substrate and the $n^-$-type epitaxial layer together configure a semiconductor substrate (semiconductor chip) that forms an $n^-$-type drift region.

FIG. 28 is a diagram schematically depicting an MCZ wafer used in a manufacture of a conventional semiconductor device and a MCZ ingot from which the MCZ wafer is sliced. As depicted in FIG. 28, an MCZ ingot 100 is fabricated by pulling, in a vertical direction from inside crucible (not depicted), a single crystal silicon solution for which heat convection along a horizontal direction is suppressed by an electromagnetic braking effect due to an external magnetic field. Boron (B), which is a p-type impurity dopant, has a large segregation coefficient with respect to the single crystal silicon solution and does not easily dissolve in the single crystal silicon solution. Therefore, resistivity of the MCZ ingot 100 of a p-type varies less as compared to resistivity for phosphorus (P), which is an n-type impurity dopant.

On the other hand, phosphorus, which is an n-type impurity dopant, has a small segregation coefficient with respect to the single crystal silicon solution and easily dissolves in the single crystal silicon solution. Therefore, an n-type impurity concentration of the MCZ ingot 100 of an n-type is higher (resistivity is lower) at a lower part 102 thereof than at an upper part 101 thereof from which pulling from the crucible occurs first and as a whole, varies about ±40% to ±50%. Thus, to stably obtain stably obtain predetermined characteristics and a predetermined breakdown voltage, about ±20% with respect to a target resistivity (design value, for example, about 100 Ω·cm) of the $n^-$-type drift region of the IGBT is set as standard for a resistivity of an MCZ wafer 100' that forms the $n^-$-type starting substrate. The standard for the resistivity of the MCZ wafer 100' may be about ±15% of the target resistivity (design value) of the $n^-$-type drift region of the IGBT or may be about ±10%. The narrower is the standard of the resistivity of the MCZ wafer 100', the more stably predetermined characteristics and a predetermined breakdown voltage may be realized.

When the standard for the resistivity of the MCZ wafer 100' is about 100 Ω·cm±10% to about 100 Ω·cm±20% and the resistivity of the upper part 101 of the MCZ ingot 100 is adjusted to be within the standard for the resistivity of the MCZ wafer 100', the resistivity of the lower part 102 of the MCZ ingot 100 is outside the standard for the resistivity of the MCZ wafer 100'. Therefore, only the upper part 101 of the MCZ ingot 100 is used to fabricate the MCZ wafer 100' that forms the $n^-$-type starting substrate that functions as the $n^-$-type drift region of the IGBT. Of the MCZ ingot 100, the lower part 102 that is outside the standard for the resistivity of the MCZ wafer 100' is not used.

As a method of manufacturing an IGBT that uses an n-type starting substrate, a method of completely removing the n-type starting substrate and using only an $n^-$-type epitaxial layer as a semiconductor substrate, after forming, on the n-type starting substrate, the $n^-$-type epitaxial layer that forms a drift region has been proposed (for example, refer to Japanese Laid-Open Patent Publication No. 2013-102111). In Japanese Laid-Open Patent Publication No. 2013-102111, by irradiating heavy particles such as protons ($H^+$) or helium ($3He^{++}$, $4He^{++}$) on the $n^-$-type epitaxial layer that is the semiconductor substrate, a region that contributes to reducing the reverse recovery time and a region that contributes to mitigating hard recovery are formed.

SUMMARY OF THE INVENTION

According to an embodiment of the invention, a semiconductor device includes a semiconductor substrate having a first main surface and a second main surface, the semiconductor substrate including a first-conductivity-type substrate, and a first-conductivity-type epitaxial layer provided on the first-conductivity-type substrate, the first-conductivity-type epitaxial layer having first and second surfaces opposite to each other, the first surface being in contact with the first-conductivity-type substrate and the second surface being the first main surface of the semiconductor substrate, the first-conductivity-type substrate having third and fourth surfaces opposite to each other, the third surface being in contact with the first-conductivity-type epitaxial layer and the fourth surface being the second main surface of the semiconductor substrate; a plurality of trenches having sidewalls and reaching a predetermined depth from the first main surface of the semiconductor substrate and terminating in the first-conductivity-type epitaxial layer; a plurality of gate electrodes respectively provided in the plurality of trenches via a gate insulating film; a plurality of first semiconductor regions of a second conductivity type, provided in surface regions of the semiconductor substrate at the first main surface thereof and exposed at the sidewalls of the plurality of trenches; a second semiconductor region provided at a surface region of the semiconductor substrate at the second main surface thereof; a first electrode electrically connected to the plurality of first semiconductor regions; and a second electrode electrically connected to the second semiconductor region. The semiconductor substrate includes a hydrogen-donor introduced part formed by a hydrogen donor introduced from the second main surface, a concentration of the hydrogen donor in the hydrogen-donor introduced part being greatest at a first depth position, which is a position in a depth direction separate from bottoms of the plurality of trenches by a distance that is at least two times the depth of the plurality of trenches, the first depth position being closer to the second main surface than are the bottoms of the plurality of trenches. The first-conductivity-type substrate and the first-conductivity-type epitaxial layer each have a first-conductivity-type impurity dopant, an impurity concentration of the first-conductivity-type impurity dopant of the first-conductivity-type substrate being lower than an impurity concentration of the first-conductivity-type impurity dopant of the first-conductivity-type epitaxial layer. A difference between a first resistivity, which is a resistivity corresponding to a total impurity concentration of the first-conductivity-type impurity dopant and the hydrogen donor of the first-conductivity-type substrate, and a second resistivity, which is a resistivity corresponding to the impurity concentration of the first-conductivity-type impurity dopant of the first-conductivity-type epitaxial layer, is at most 20%.

In the embodiment, the hydrogen-donor introduced part is provided spanning the first-conductivity-type substrate and the first-conductivity-type epitaxial layer.

In the embodiment, the hydrogen-donor introduced part is separate from the first-conductivity-type epitaxial layer. The total impurity concentration of the first-conductivity-type substrate has a predetermined impurity concentration at a second depth position, and exhibits a Gaussian distribution and progressively decreases from the first depth position across the semiconductor substrate toward the first main surface and toward the second depth position, and exhibits a uniform impurity concentration distribution, or an impurity concentration distribution in which the total impurity concentration gradually decreases at a predetermined slope, from the second depth position across the semiconductor substrate toward the second main surface, and a distance between an end of the hydrogen-donor introduced part closest to the first main surface and an end of the first-conductivity-type epitaxial layer closest to the second main surface is at most a full width at half maximum (FWHM) of the Gaussian distribution or at most one half of a thickness of the first-conductivity-type epitaxial layer.

In the embodiment, the semiconductor device further includes an active region in which the plurality of gate electrodes is provided; a termination region surrounding a periphery of the active region; and a second-conductivity-type well region provided in the termination region and surrounding the periphery of the active region, the second-conductivity-type well region being exposed at the sidewalls of outermost ones of the plurality of trenches. The second-conductivity-type well region penetrates the first-conductivity-type substrate from the first main surface of the semiconductor substrate.

In the embodiment, the hydrogen-donor introduced part is provided across the second-conductivity-type well region.

In the embodiment, the first-conductivity-type substrate is a silicon substrate sliced from an ingot formed by a magnetic Czochralski method.

According to another embodiment of the invention, a method of manufacturing a semiconductor device includes preparing a first-conductivity-type substrate sliced from an ingot formed by a magnetic Czochralski method, depositing a first-conductivity-type epitaxial layer on the first-conductivity-type substrate, the first-conductivity-type epitaxial layer having an impurity concentration of a first-conductivity-type impurity dopant higher than an impurity concentration of the first-conductivity-type impurity dopant in the first-conductivity-type substrate; forming a plurality of trenches reaching a predetermined depth from an exposed surface of the first-conductivity-type epitaxial layer to terminate in the first-conductivity-type epitaxial layer; forming a plurality of gate electrodes in the plurality of trenches, respectively, via a gate insulating film; forming a plurality of first semiconductor regions of a second conductivity type at surface regions of the exposed surface of the first-conductivity-type epitaxial layer through a first ion-implantation, the plurality of first semiconductor regions being exposed at sidewalls of the plurality of trenches; forming a first electrode electrically connected to the plurality of first semiconductor regions; forming a second semiconductor region at a surface region of an exposed surface of the first-conductivity-type substrate through a second ion-implantation; forming crystal defects in the first-conductivity-type substrate through an implantation of protons from the exposed surface of the first-conductivity-type substrate; introducing a hydrogen donor into the first-conductivity-type substrate by converting the crystal defects into donors through a heat treatment; and forming a second electrode electrically connected to the second semiconductor region. During the implantation of the protons, a depth position of a range of the protons, corresponding to where a concentration of the hydrogen donor is to be greatest, is a position in a depth direction separate from bottoms of the plurality of trenches by a distance that is at least two times of the depth of the plurality of trenches, the depth position being closer to the exposed surface of the first-conductivity-type substrate than are the bottoms of the plurality of trenches. The first-conductivity-type substrate and the first-conductivity-type epitaxial layer each have the first-conductivity-type impurity dopant when the hydrogen donor is introduced. A difference between a first resistivity, which is a resistivity corresponding to a total impurity concentration of the first-conductivity-type impurity dopant and the hydrogen donor of the first-conductivity-type substrate, and a second resistivity, which is a resistivity corresponding to the impurity concentration of the first-conductivity-type impurity dopant of the first-conductivity-type epitaxial layer, is at most 20%.

In the embodiment, during the implantation of the protons, the depth position is at an interface between the first-conductivity-type substrate and the first-conductivity-type epitaxial layer, or is in the first-conductivity-type epitaxial layer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 28 is a diagram schematically depicting a MCZ wafer used in a manufacture of a conventional semiconductor device and a MCZ ingot from which the MCZ wafer is sliced.

DETAILED DESCRIPTION OF THE INVENTION

Figure 1:
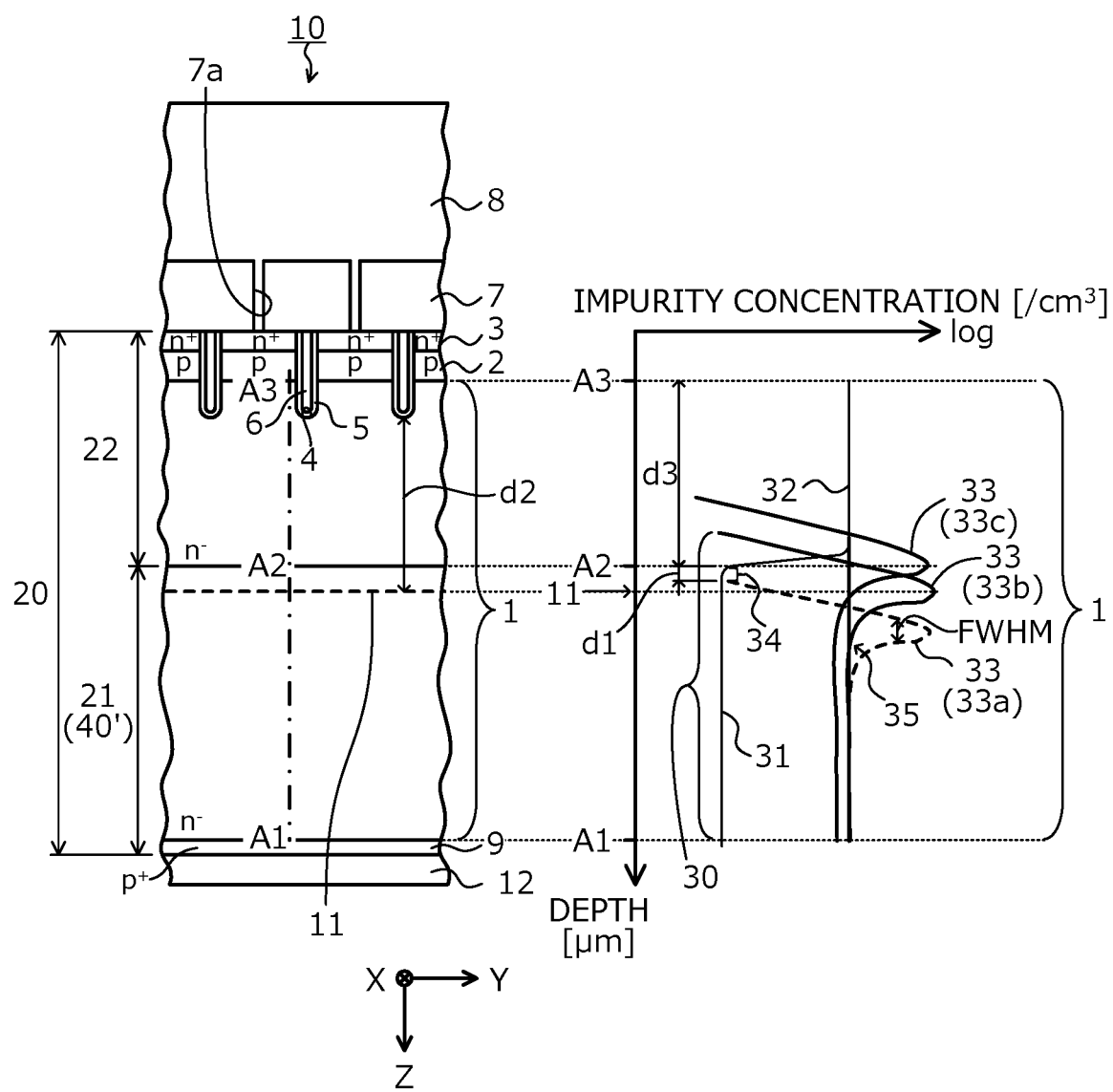
FIG. 1 is a diagram depicting impurity concentration distribution for a cross-sectional view of a structure of a semiconductor device according to a first embodiment.

First, problems associated with the conventional techniques will be described. In general, a semiconductor wafer having a large diameter (for example, at least 8 inches) has a high unit cost and is difficult fabricate by a method other than an MCZ method and therefore, is fabricated using an MCZ method. Nonetheless, as described above, when the MCZ ingot 100 is an n-type, in the MCZ ingot 100, only the upper part 101 that satisfies the standard for the resistivity of the MCZ wafer 100' is used to fabricate the MCZ wafer 100' that becomes the $n^-$-type starting substrate of the IGBT and the lower part 102 that is outside the standard for the resistivity of the MCZ wafer 100' is not used.

In this manner, in the MCZ ingot 100, when only the part (the upper part 101) within the standard for the resistivity of the MCZ wafer 100' is used, the narrower is the standard for the resistivity of the MCZ wafer 100', the number of the MCZ wafers 100' obtained from a single MCZ ingot 100 decreases. Further, the larger is the diameter of the MCZ wafer 100', the larger is the lower part 102 that is not used of the MCZ ingot 100. Therefore, the unit price of the MCZ wafer 100' with respect to a single MCZ ingot 100 increases.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
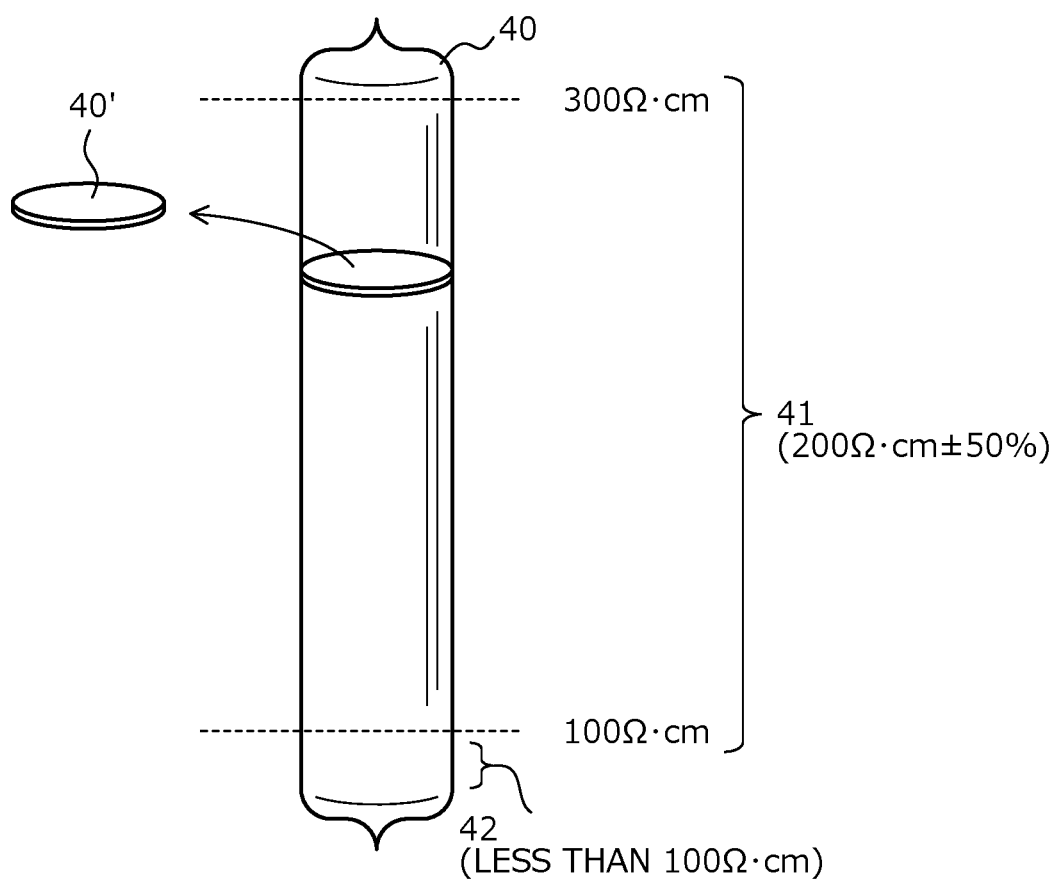
FIG. 2 is a diagram schematically depicting a MCZ wafer used in the structure of the semiconductor device according to the first embodiment and a MCZ ingot from which the MCZ wafer is sliced.

A structure of a semiconductor device according to a first embodiment will be described taking, as an example, a vertical IGBT having a trench gate structure. FIG. 1 is a diagram depicting impurity concentration distribution for a cross-sectional view of the structure of the semiconductor device according to the first embodiment. FIG. 2 is a diagram schematically depicting a MCZ wafer used in the structure of the semiconductor device according to the first embodiment and a MCZ ingot from which the MCZ wafer is sliced. A MCZ wafer 40' that is sliced from a MCZ ingot 40 depicted in FIG. 2 is used to fabricate (manufacture) a semiconductor device 10 according to the first embodiment depicted in FIG. 1.

FIG. 1 depicts n-type impurity concentration distributions 31, 32, 33 on a right side of the drawing, for structures of an active region 71 (refer to FIG. 24), depicted on a left side of the drawing in a cross-sectional view. For the n-type impurity concentration distribution 33, three examples (reference characters 33a, 33b, 33c) are depicted. Along cutting line A1-A2-A3 are depth positions of an $n^-$-type drift region 1. Reference character A1 represents an interface between the $n^-$-type drift region 1 and a $p^+$-type collector region 9. Reference character A2 represents an interface between an $n^-$-type starting substrate 21 and an type epitaxial layer 22. Reference character A3 represents interfaces between the $n^-$-type drift region 1 and p-type base regions 2.

The active region 71 is a region through which current passes when the IGBT is in an ON state and in which unit cells (constituent units of an element) of the IGBT are disposed adjacent to one another. A periphery of the active region 71 is surrounded by an edge termination region 72 (refer to FIG. 24). The edge termination region 72 is a region that mitigates electric field at a front side of a semiconductor substrate 20 and sustains a breakdown voltage. In the edge termination region 72, the breakdown voltage is a voltage limit at which no errant operation or destruction of an element occurs. A cross-sectional view of the structure of the edge termination region 72 will be described hereinafter in a third embodiment.

The semiconductor device 10 according to the first embodiment depicted in FIG. 1 is a vertical IGBT having a general trench-gate-type MOS gate structure on the semiconductor substrate (semiconductor chip) 20 formed by the $n^-$-type starting substrate (first-conductivity-type substrate) 21 and an $n^-$-type epitaxial layer (first-conductivity-type epitaxial layer) 22. The semiconductor substrate 20 is an epitaxial substrate in which the $n^-$-type epitaxial layer 22 is formed by epitaxial growth on a front surface of the $n^-$-type starting substrate 21. The semiconductor substrate 20, for example, has silicon (Si) as a semiconductor material.

The semiconductor substrate 20 has, as a front surface (first main surface), a main surface on a side thereof having the n$^-$-type epitaxial layer 22 and as a back surface (second main surface), a main surface (back surface of the n$^-$-type starting substrate 21) on a side thereof having the n$^-$-type starting substrate 21. The n$^-$-type starting substrate 21 and the n$^-$-type epitaxial layer 22 have substantially equal n-type impurity concentrations and function as the type drift region 1. The n$^-$-type starting substrate 21 and the n$^-$-type epitaxial layer 22 having substantially equal n-type impurity concentrations means that a difference in resistivity due to a difference of the n-type impurity concentrations is less than 20%.

The n$^-$-type starting substrate 21 is formed using the semiconductor wafer (MCZ wafer, FIG. 2) 40' of an n$^-$-type, sliced from the single crystal silicon (Si) ingot (MCZ ingot, FIG. 2) 40 of an n$^-$-type, fabricated by a MCZ method. The n$^-$-type starting substrate 21 contains an n-type impurity dopant such as phosphorus (P) or antimony (Sb) contained in the MCZ ingot 40 and a hydrogen donor (hereinafter, simply, hydrogen donor) introduced by a later-described proton (H$^+$) implantation 53 and a first heat treatment (refer to steps S9, S10 depicted in FIG. 3).

The n-type impurity concentration (thin solid line indicated by reference numeral 31) of the n-type impurity dopant in the n$^-$-type starting substrate 21 is lower than an n-type impurity concentration of the hydrogen donor of the n$^-$-type starting substrate 21. A total n-type impurity concentration of the n$^-$-type starting substrate 21 is substantially equal to an n-type impurity concentration (thin solid line indicated by reference numeral 32) of the n$^-$-type epitaxial layer 22. The total n-type impurity concentration of the n$^-$-type starting substrate 21 is an integrated value of the n-type impurity concentration of the hydrogen donor and the n-type impurity dopant in the n$^-$-type starting substrate 21, and realizes the target resistivity (design value) of the n$^-$-type drift region 1.

The n-type impurity concentration of the n-type impurity dopant of the type starting substrate 21 is an n-type impurity concentration within a standard for the resistivity of the MCZ wafer 40', and is an n-type impurity concentration realized by only the n-type impurity dopant added to the single crystal silicon solution that is a material of the MCZ ingot 40. The MCZ ingot 40 is fabricated by suppressing heat convection in a horizontal direction by an electromagnetic braking effect due to an external magnetic field, and pulling, in a vertical direction from a crucible (not depicted), the single crystal silicon solution to which the n-type impurity dopant is added.

In the first embodiment as well, similarly to the conventional MCZ ingot 100 of an n-type, in the MCZ ingot 40 of the n-type, the n-type impurity concentration at a part 42 at a lower end may become high (resistivity is low) and outside the standard for the resistivity of the MCZ wafer 40' due to effects of the segregation coefficient and solid solubility of the n-type impurity dopant; however, in the first embodiment, the standard for the resistivity of the MCZ wafer 40' may be set to be higher than the target resistivity of the n$^-$-type drift region 1 and may be set more widely than the standard for the resistivity of the conventional MCZ wafer 100' (refer to FIG. 28).

The standard for the resistivity of the MCZ wafer 40', for example, is about ±50% with respect to a predetermined resistivity (for example, about 200 Ω·cm, when the target resistivity of the n$^-$-type drift region 1 is about 100 Ω·cm) that is higher than the target resistivity of the n$^-$-type drift region 1. Therefore, a larger upper part 41 of the MCZ ingot 40 may be set to be within the standard for the resistivity of the MCZ wafer 40', whereby the part 42 that is outside the standard for the resistivity of the MCZ wafer 40' becomes smaller or the part 42 that is outside the standard for the resistivity of the MCZ wafer 40' may be eliminated.

In this manner, even when the standard for the resistivity of the MCZ wafer 40' is higher than the target resistivity of the n$^-$-type drift region 1, introduction of a hydrogen donor into the n$^-$-type starting substrate 21 during a manufacturing process, thereby enables the resistivity of the n$^-$-type starting substrate 21 to be reduced and set to a resistivity that is substantially equal to the resistivity (the target resistivity of the n$^-$-type drift region 1) of the n$^-$-type epitaxial layer 22. The resistivities being substantially equal means that a resistivity difference is less than 20%. Therefore, the larger part 41 of the MCZ ingot 40 may be used for the semiconductor device 10 according to the first embodiment and the unit price of the MCZ wafer 40' with respect to one MCZ ingot 40 may be reduced.

The total n-type impurity concentration of the n$^-$-type starting substrate 21 is higher than the n-type impurity concentration distribution 31 of the n-type impurity dopant of the n$^-$-type starting substrate 21 due to the hydrogen donor introduced into the semiconductor substrate 20. The total n-type impurity concentration distribution 33 of a part (hereinafter, hydrogen-donor introduced part) 30 of the semiconductor substrate 20, where the hydrogen donor is introduced is depicted at the right side of FIG. 1. The total n-type impurity concentration distribution 33 of the hydrogen-donor introduced part 30 is an n-type impurity concentration distribution integrating the n-type impurity dopant and the hydrogen donor. The hydrogen donor is a donor due to composite defects generated by voids (V), oxygen (O), and hydrogen (H) combining.

As described hereinafter, the proton implantation 53 is performed from the back surface of the semiconductor substrate 20. The total n-type impurity concentration distribution 33 of the hydrogen-donor introduced part 30 indicates a maximum value (peak impurity concentration) at a depth position (hereinafter, proton range position) 11 of the range of the proton implantation 53, and exhibits a concentration distribution that is close to Gaussian distribution in which the concentration gradually decreases with increasing proximity to both main surfaces of the semiconductor substrate 20 from the proton range position (first depth position) 11. The n-type impurity concentration at the proton range position 11 is higher than the n-type impurity concentration of the n$^-$-type epitaxial layer 22 and is the maximum value in the n$^-$-type drift region 1. In FIG. 1, correspondence between the total n-type impurity concentration distribution 33$b$ and the proton range position 11 and the hydrogen-donor introduced part 30 is depicted.

The proton range position 11 is positioned closer to a collector (the p$^+$-type collector region (second semiconductor region) 9) than are bottoms of trenches 4. The proton range position 11 may be in the n$^-$-type epitaxial layer 22 (refer to the total n-type impurity concentration distribution 33$d$ in FIG. 21), or at an interface (the total n-type impurity concentration distribution 33$c$) between the n$^-$-type starting substrate 21 and the n$^-$-type epitaxial layer 22. When the proton range position 11 is closer to an emitter than is the interface between the n$^-$-type starting substrate 21 and the n$^-$-type epitaxial layer 22, the hydrogen donor is introduced into the entire n$^-$-type starting substrate 21.

The proton range position 11 may be in the n⁻-type starting substrate 21. In this case, the proton range position 11 may be positioned as close as possible to the interface with the n⁻-type epitaxial layer 22 (the total n-type impurity concentration distribution 33b). The proton range position 11 may be positioned slightly apart from the interface between the n⁻-type starting substrate 21 and the n⁻-type epitaxial layer 22, closer to the collector (the total n-type impurity concentration distribution 33a); however, in this case, a non-hydrogen-introduced part 34 described hereinafter is set to satisfy the following conditions.

The total n-type impurity concentration distribution 33 of the hydrogen-donor introduced part 30 may overlap the n⁻-type epitaxial layer 22 (the total n-type impurity concentration distributions 33b, 33c, 33d), or may be distributed only in the n⁻-type starting substrate 21 (the total n-type impurity concentration distribution 33a). When the total n-type impurity concentration distribution 33a of the hydrogen-donor introduced part 30 does not overlap the n⁻-type epitaxial layer 22, in the n⁻-type starting substrate 21, between a part thereof in which the hydrogen donor is introduced and the n⁻-type epitaxial layer 22, a part having an n-type impurity concentration of only the n-type impurity dopant (hereinafter, non-hydrogen-introduced part) 34 is present.

When the non-hydrogen-introduced part 34 is present, a thickness (distance from an end of the hydrogen-donor introduced part 30 closest to the emitter to an end of the n⁻-type epitaxial layer 22 closest to the collector) d1 of the non-hydrogen-introduced part 34 in a depth direction Z suffices to be at most a thickness that is ½ a thickness d3 of parts (parts of the n⁻-type epitaxial layer 22 becoming the n⁻-type drift region 1) of the n⁻-type epitaxial layer 22 sandwiched between the n⁻-type starting substrate 21 and p-type base regions (first semiconductor regions) 2, or at most a full width at half maximum (FWHM) of the Gaussian distribution of the total n-type impurity concentration distribution 33a of the hydrogen-donor introduced part 30 and having the proton range position 11 as a reference.

Further, the total n-type impurity concentration distribution 33 of the hydrogen-donor introduced part 30 (33a to 33c) gradually decreases with increasing proximity to the collector from the proton range position 11, and at a predetermined depth position (second depth position) 35, becomes an n-type impurity concentration that realizes the target resistivity of the n⁻-type drift region 1, thereby becoming an impurity concentration distribution that is uniform (flat) from the depth position 35 to the p⁺-type collector region 9 or an impurity concentration distribution that gradually decreases with a slope of, for example, about 10%. The total n-type impurity concentration of the hydrogen-donor introduced part 30 being uniform means a substantially equal impurity concentration in a range that includes manufacturing tolerance (for example, less than 30%) for process variation.

The n⁻-type epitaxial layer 22 has an n-type impurity concentration that enables realization of the target resistivity of the n⁻-type drift region 1. The n-type impurity concentration of the n⁻-type epitaxial layer 22 is obtained by only an n-type impurity dopant such as phosphorus or antimony doped in the n⁻-type epitaxial layer 22. The impurity concentration at a surface region of the n⁻-type epitaxial layer 22 facing the collector decreases with increasing proximity to the interface with the n⁻-type starting substrate 21 due to diffusion of the n-type impurity dopant by a heat treatment performed after the n⁻-type epitaxial layer 22 is deposited.

The MOS gate structure has a general trench gate structure configured by the p-type base regions 2, n⁺-type emitter regions 3, p⁺-type contact regions (not depicted), the trenches 4, a gate insulating film 5, and gate electrodes 6. The p-type base regions 2, the n⁺-type emitter regions 3, and the p⁺-type contact regions are each a diffusion region selectively formed in the n⁻-type epitaxial layer 22 by ion implantation to be provided in surface regions of the semiconductor substrate 20.

The p-type base regions 2 are provided in the n⁻-type epitaxial layer 22, at surface regions of the semiconductor substrate 20, at the front surface thereof. A part of the n⁻-type epitaxial layer 22 closer to the collector than are the p-type base regions 2 is the n⁻-type drift region 1. The p-type base regions 2 are in contact with the n⁻-type drift region 1 configured by the n⁻-type epitaxial layer 22 and are disposed separate from the n⁻-type starting substrate 21.

The n⁺-type emitter regions 3 and the p⁺-type contact regions are selectively provided between the front surface of the semiconductor substrate 20 and the p-type base regions 2 to be in contact with the p-type base regions 2 and are exposed at the front surface of the semiconductor substrate 20. The n⁺-type emitter regions 3 and the p⁺-type contact regions are disposed between (mesa region) adjacent trenches of the trenches 4, for example, alternating one another along a first direction X (direction of view in FIG. 1) in which the trenches 4 extend parallel to the front surface of the semiconductor substrate 20.

Further, the n⁺-type emitter regions 3 and the p⁺-type contact regions each reaches the adjacent trenches 4 in a second direction Y (horizontal direction in FIG. 1) that is parallel to the front surface of the semiconductor substrate 20 and orthogonal to the first direction X, and each is exposed at sidewalls of the trenches 4. The p⁺-type contact regions may be omitted. When the p⁺-type contact regions are omitted, instead of the p⁺-type contact regions, the p-type base regions 2 are exposed at the front surface of the semiconductor substrate 20 and the sidewalls of the trenches 4.

From the front surface of the semiconductor substrate 20, the trenches 4 penetrate through the n⁺-type emitter regions 3 and the p⁺-type contact regions (when the p⁺-type contact regions are omitted, instead of the p⁺-type contact regions, the p-type base regions 2) and the p-type base regions 2 directly beneath these regions, respectively, and reach the n⁻-type drift region 1. Bottoms of the trenches 4 terminate in the n⁻-type epitaxial layer 22 and do not reach the n⁻-type starting substrate 21.

Further, the bottoms of the trenches 4 terminate closer to the emitter (the n⁺-type emitter regions 3) than is the proton range position 11. A distance d2 from the bottoms of the trenches 4 to the proton range position 11 is at least two times a depth of the trenches 4. The inventors confirmed that when the distance d2 from the bottoms of the trenches 4 to the proton range position 11 is less than two times the depth of the trenches 4, the predetermined breakdown voltage is not obtained. Further, when the distance d2 from the bottoms of the trenches 4 to the proton range position 11 is less than two times the depth of the trenches 4, damage may occur in the gate insulating film 5 due to the proton implantation 53.

In the trenches 4, the gate electrodes 6 are provided via the gate insulating film 5. Trench gates are configured by the trenches 4, the gate insulating film 5, and the gate electrodes 6. An interlayer insulating film 7 is provided at an entire area of the front surface of the semiconductor substrate 20 and covers the gate electrodes 6. In the interlayer insulating film 7, contact holes 7a that penetrate through the interlayer insulating film 7 in the depth direction Z and reach the semiconductor substrate 20 are provided. In the contact holes 7a, the n+-type emitter regions 3 and the p+-type contact regions (when the p+-type contact regions are omitted, instead of the p+-type contact regions, the p-type base regions 2) are exposed.

An emitter electrode (first electrode) 8 is in ohmic contact with the n+-type emitter regions 3 and the p+-type contact regions (when the p+-type contact regions are omitted, instead of the p+-type contact regions, the p-type base regions 2) via the contact holes 7a and is electrically connected to the n+-type emitter regions 3, the p+-type contact regions, and the p-type base regions 2. At a surface region of the semiconductor substrate 20, at the back surface (back surface of the n−-type starting substrate 21) thereof, the p+-type collector region 9 is provided. The p+-type collector region 9 is exposed at the back surface of the semiconductor substrate 20.

A part of the n−-type starting substrate 21 closer to the emitter than is the p+-type collector region 9 is the n−-type drift region 1. The p+-type collector region 9 is in contact with the n−-type drift region 1 that is configured by the type starting substrate 21, and is disposed separate from the n−-type epitaxial layer 22. A contact electrode (second electrode) 12 is provided at an entire area of the back surface of the semiconductor substrate 20. The contact electrode 12 is in ohmic contact with the p+-type collector region 9 and is electrically connected to the p+-type collector region 9.

Figure 3:
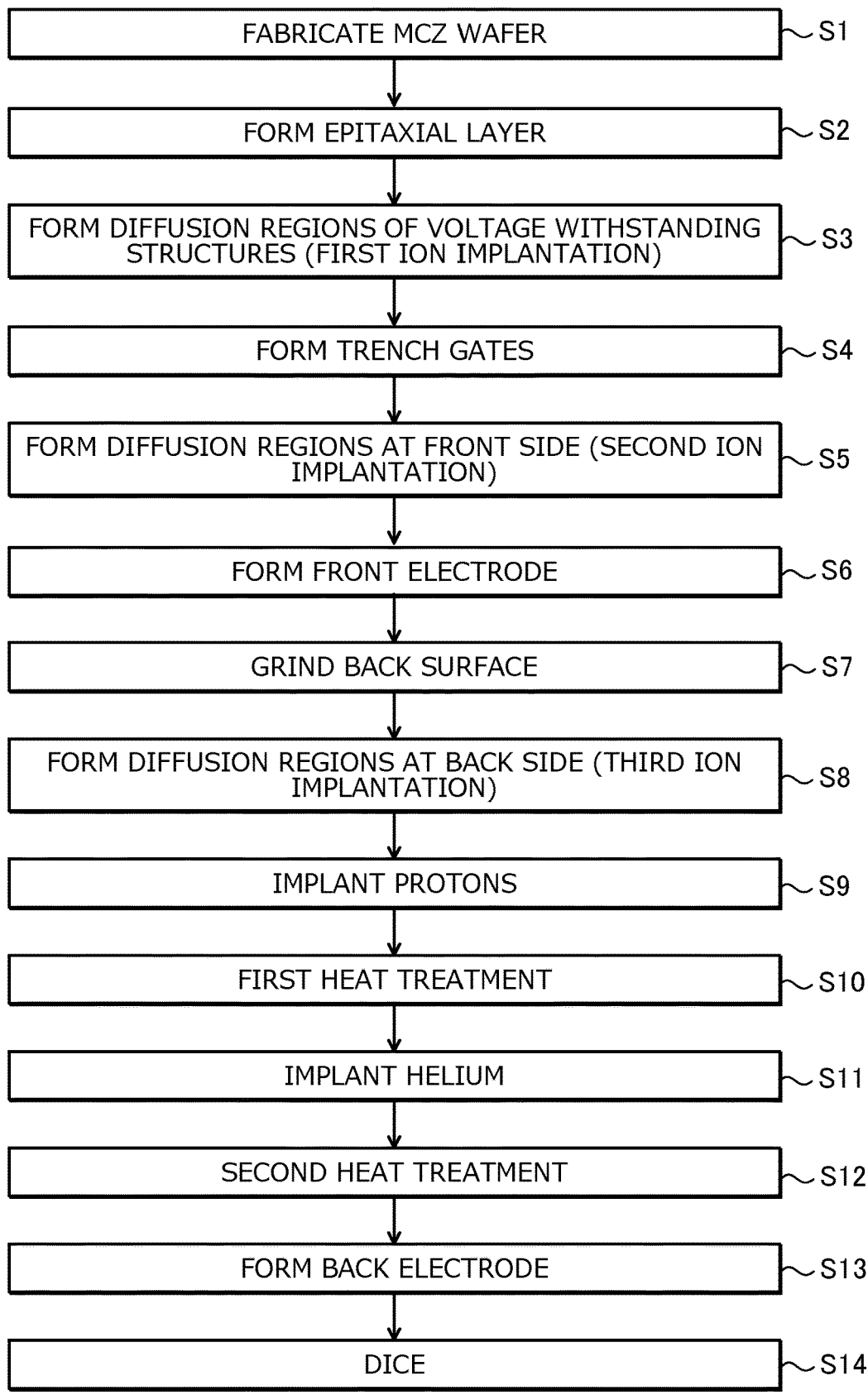
FIG. 3 is a flowchart depicting an outline of a method of manufacturing the semiconductor device according to the first embodiment.
Figure 19:
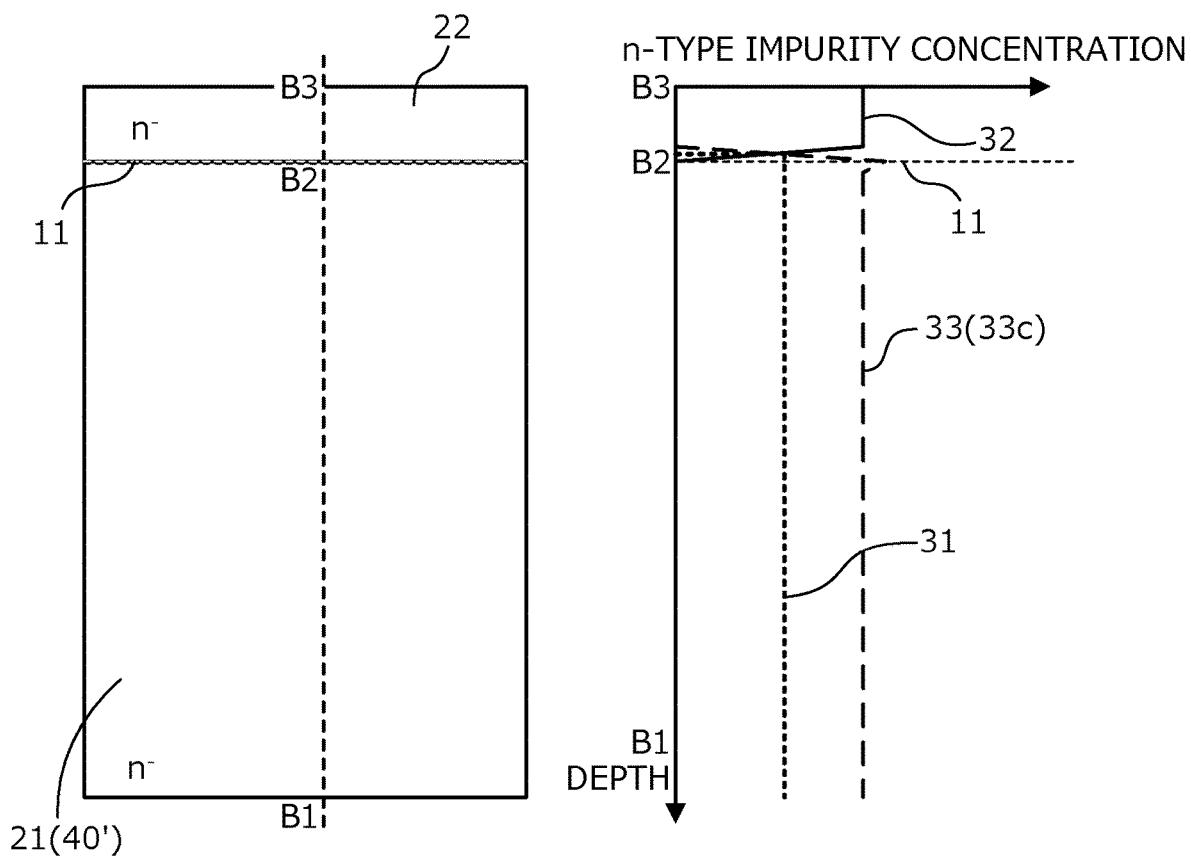
FIG. 19 is a diagram of an example of n-type impurity concentration distribution of the semiconductor substrate depicted in FIG. 12.
Figure 20:
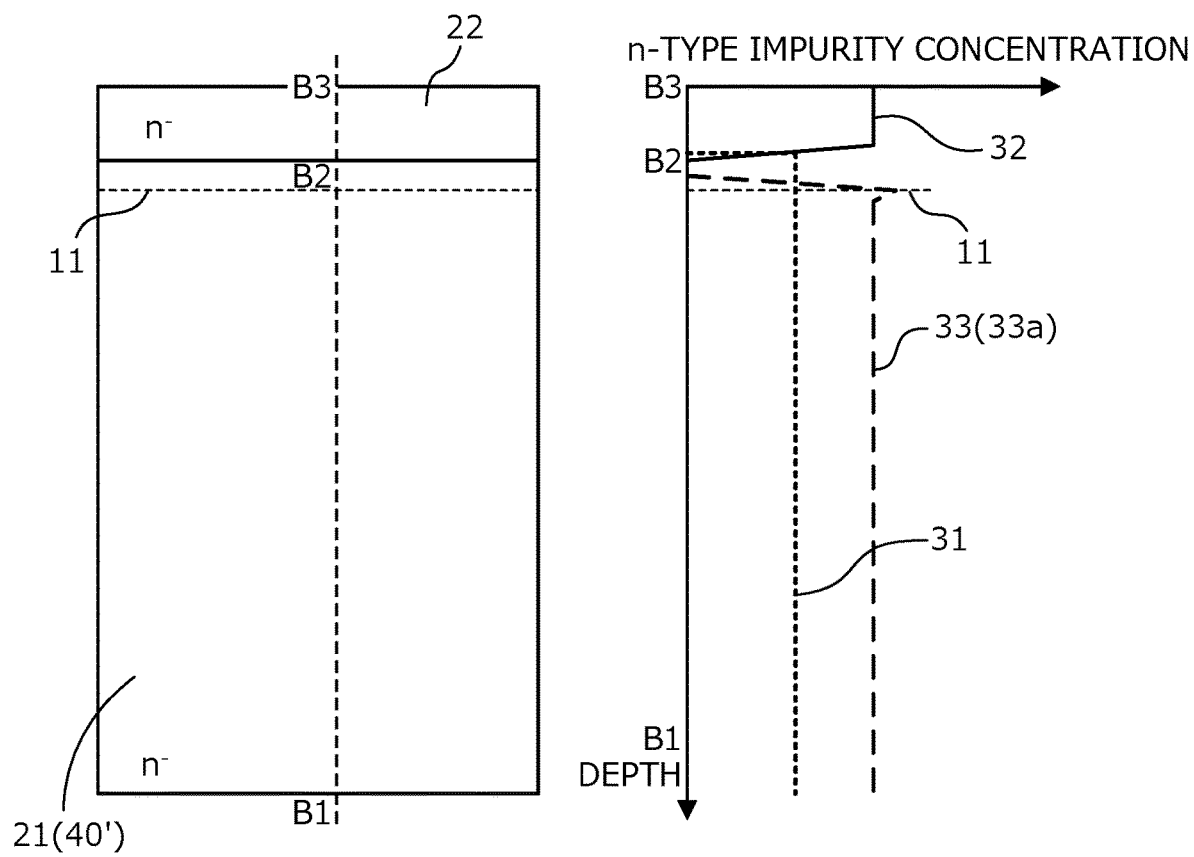
FIG. 20 is a diagram of an example of n-type impurity concentration distribution of the semiconductor substrate depicted in FIG. 12.
Figure 21:
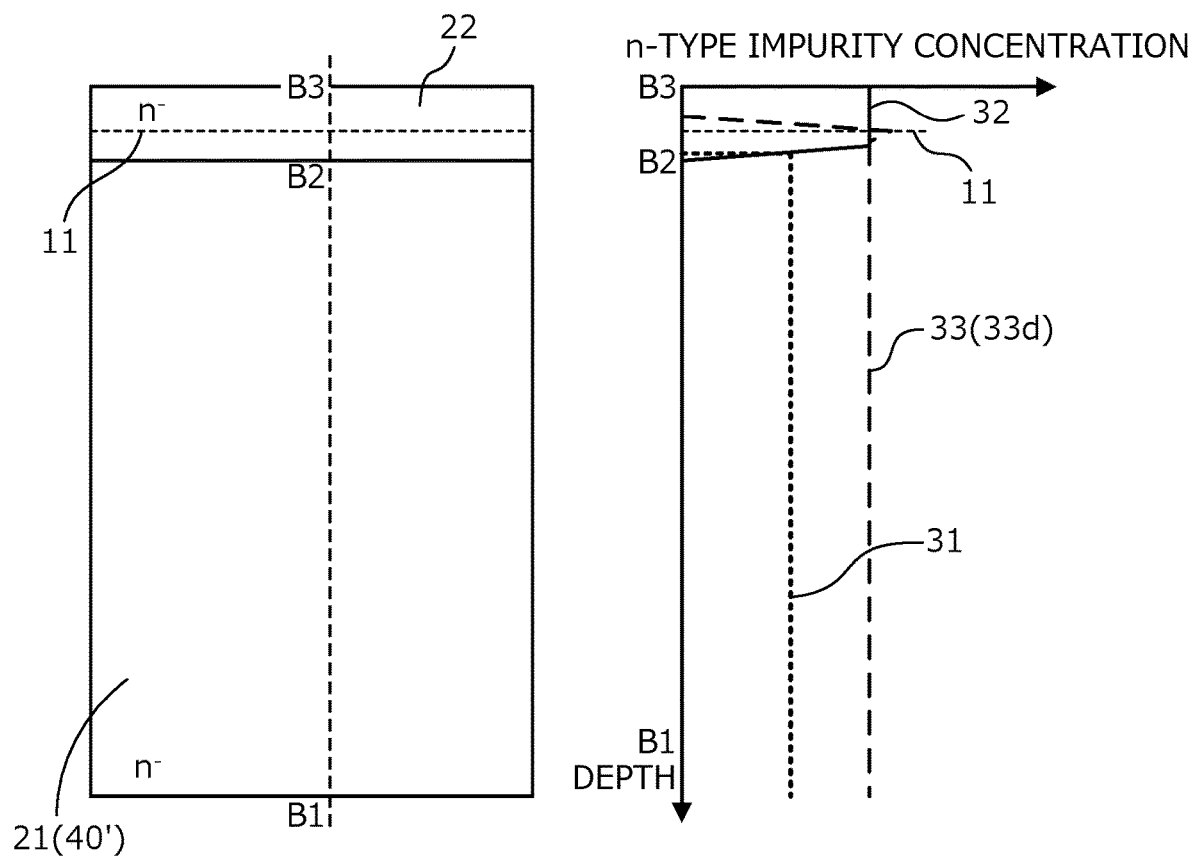
FIG. 21 is a diagram of an example of n-type impurity concentration distribution of the semiconductor substrate depicted in FIG. 12.

Next, a method of manufacturing the semiconductor device 10 according to the first embodiment will be described. FIG. 3 is a flowchart depicting an outline of the method of manufacturing the semiconductor device according to the first embodiment. FIGS. 4, 5, 6, 7, 8, 9, 10, 11, and 12 are cross-sectional views depicting states of the structure of the semiconductor device according to the first embodiment during manufacture. FIGS. 13, 14, 15, 16, 17, and 18 are enlarged views of parts of FIGS. 6 to 10, and 12. FIGS. 19, 20, and 21 are diagrams of examples of n-type impurity concentration distribution of the semiconductor substrate depicted in FIG. 12. The proton range position 11 differs in FIGS. 19 to 21.

FIGS. 19 to 21 depict the n-type impurity concentration distributions 31 to 33 on the right side of the drawings, for the structures depicted on the left side of the drawing in a cross-sectional view. In the cross-sectional views depicted in FIGS. 19 to 21, only the n−-type drift region 1 (a portion of the n−-type starting substrate 21 and a portion of the n−-type epitaxial layer 22) of the semiconductor substrate 20 is depicted and parts formed in the semiconductor substrate 20 other than the n−-type drift region 1 are omitted from the drawings. In FIGS. 19 to 21, along cutting line B1-B2-B3 are depth positions of the n−-type drift region 1 and reference characters B1, B2, and B3 are depth positions equal to those of reference characters A1, A2, and A3, respectively, in FIG. 1.

Figure 4:
FIG. 4 is a cross-sectional view depicting a state of the structure of the semiconductor device according to the first embodiment during manufacture.

First, as depicted in FIG. 4, the MCZ wafer 40' of an n−-type is sliced from the MCZ ingot 40 (refer to FIG. 2) of an n−-type and containing a predetermined n-type impurity dopant, and prepared (step S1: first process). The standard for the resistivity of the MCZ wafer 40' is in a range from about ±40 to ±50% with respect to a resistivity (for example, in a range from about 200 Ω·cm to 2000 Ω·cm) higher than the target resistivity of the n−-type drift region 1. In a process at step S2 described hereinafter, the MCZ wafer 40' is the n−-type starting substrate 21 that becomes a base wafer when the n−-type epitaxial layer 22 is formed by epitaxial growth. The MCZ wafer 40' may have a thickness t1 of, for example, about 700 μm.

Figure 5:
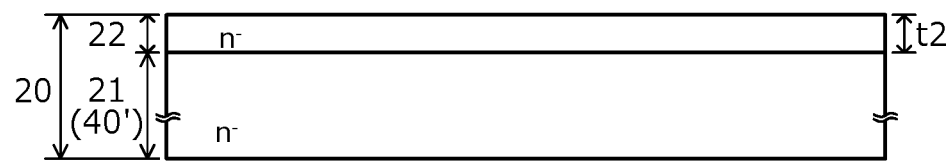
FIG. 5 is a cross-sectional view depicting a state of the structure of the semiconductor device according to the first embodiment during manufacture.

Next, as depicted in FIG. 5, on the front surface of the n−-type starting substrate 21, the n−-type epitaxial layer 22 is formed by epitaxial growth (step S2: first process), thereby forming the semiconductor substrate (semiconductor wafer) 20. Resistivity of the n−-type epitaxial layer 22 is set to be the target resistivity of the n−-type drift region 1 (for example, in a range from about 800 cm to 120 Ω·cm). An impurity concentration of the n−-type epitaxial layer 22 may be, for example, in a range from $2 \times 10^{13}/\text{cm}^3$ to $5 \times 10^{14}/\text{cm}^3$. A thickness t2 of the n−-type epitaxial layer 22 may be, for example, in a range from about 10 μm to 20 μm. The n−-type epitaxial layer 22, for example, is formed by epitaxial growth and doped with the same n-type impurity dopant as the n-type impurity dopant in the MCZ wafer 40'.

Here, while the target resistivity of the n−-type drift region 1 is set to about ±20% with respect to the design value (for example, about 100 Ω·cm) for the resistivity of the n−-type drift region 1, the target resistivity of the n−-type drift region 1 may be closer to the design value for the resistivity of the n−-type drift region 1. Therefore, with respect to the design value for the resistivity of the type drift region 1, the target resistivity of the n−-type drift region 1 may be, for example, about ±15% or may be about ±10%. The narrower an adjustment range is set for the target resistivity of the n−-type drift region 1, the resistivity of the n−-type drift region 1 is closer to the design value for the resistivity of the type drift region 1 and therefore, stabilization and realization of predetermined characteristics and a predetermined breakdown voltage is possible.

Next, at the front side of the semiconductor substrate 20, in the edge termination region 72, predetermined diffusion regions such as a p-type well region 81, field limiting rings (FLRs) 82, and a channel stopper 83 (refer to FIGS. 25 and 26) are formed by a first ion implantation (step S3). In the process at step S3, for example, these diffusion regions are selectively formed by repeatedly performing, under different conditions, a process including photolithography and the first ion implantation as one set. Further, an activation heat treatment for the impurity dopant implanted by the first ion implantation is performed.

A temperature of the activation heat treatment for the diffusion regions of the edge termination region 72 is, for example, in a range from about 1000 degrees C. to 1500 degrees C. Therefore, the n-type impurity dopant in the type epitaxial layer 22 is diffused in the n−-type starting substrate 21 by the activation heat treatment and the n-type impurity concentration distribution at a part of the n−-type epitaxial layer 22 facing the collector, gradually decreases with increasing proximity to the n−-type starting substrate 21. The part of the type epitaxial layer 22 where the impurity concentration gradually decreases with increasing proximity to the n−-type starting substrate 21 is a part having a thickness of about 8 μm from the interface with the n−-type starting substrate 21.

Figure 6:
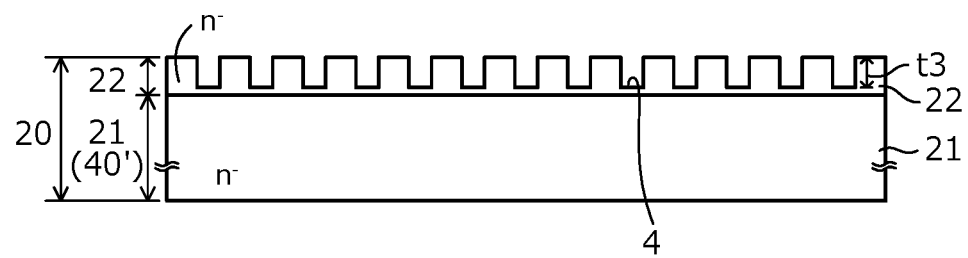
FIG. 6 is a cross-sectional view depicting a state of the structure of the semiconductor device according to the first embodiment during manufacture.
Figure 7:
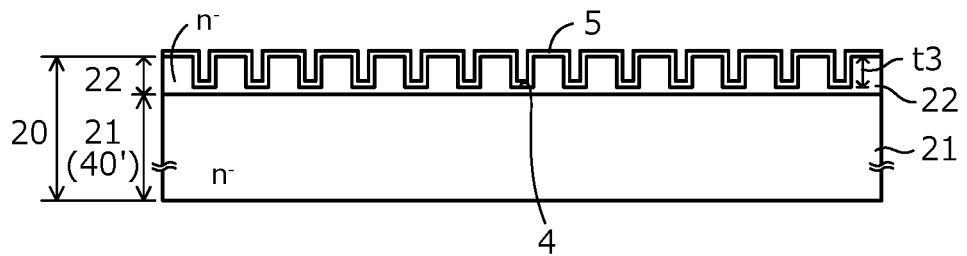
FIG. 7 is a cross-sectional view depicting a state of the structure of the semiconductor device according to the first embodiment during manufacture.
Figure 8:
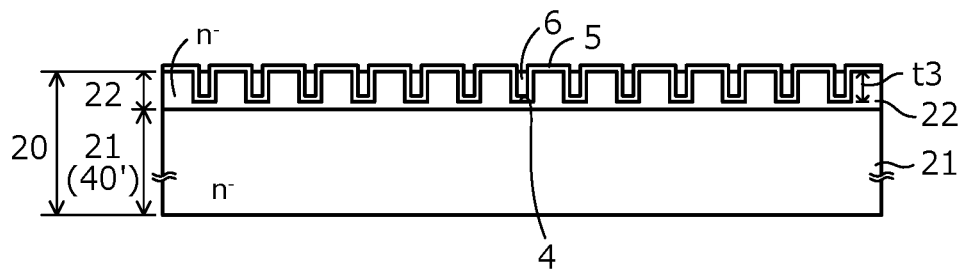
FIG. 8 is a cross-sectional view depicting a state of the structure of the semiconductor device according to the first embodiment during manufacture.
Figure 13:
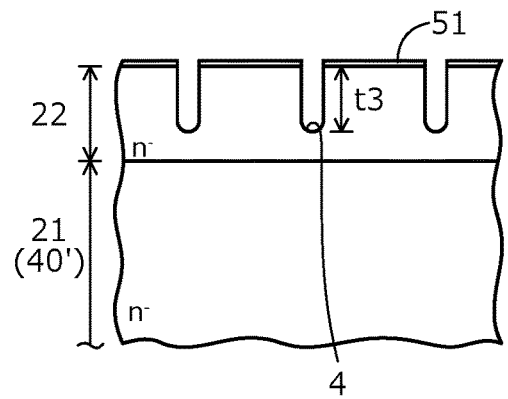
FIG. 13 is an enlarged view of a part of FIG. 6.

Next, as depicted in FIGS. 6 to 8, at the front side of the semiconductor substrate 20, in the active region 71 (refer to FIG. 24), the trench gates are formed (step S4: second and third processes). In the process at step S4, in particular, as depicted in FIGS. 6 and 13, at the front surface of the semiconductor substrate 20, an etching mask 51 opened at parts corresponding to formation regions of the trenches 4 is formed. Further, etching is performed using the etching mask 51 as a mask and the trenches 4 are formed at a predetermined depth t3 from the front surface of the semiconductor substrate 20, not reaching the n⁻-type starting substrate 21. The depth t3 of the trenches 4 may be, for example, in a range from about 3 µm to 10 µm.

Figure 14:
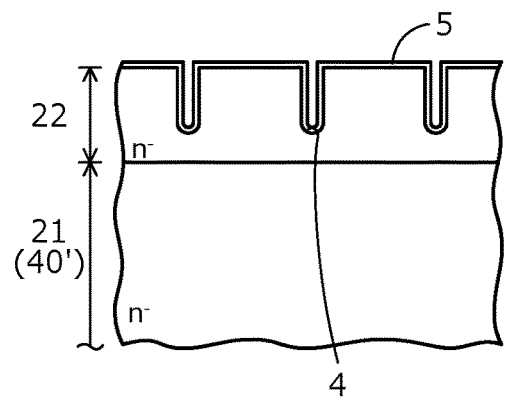
FIG. 14 is an enlarged view of a part of FIG. 7.
Figure 15:
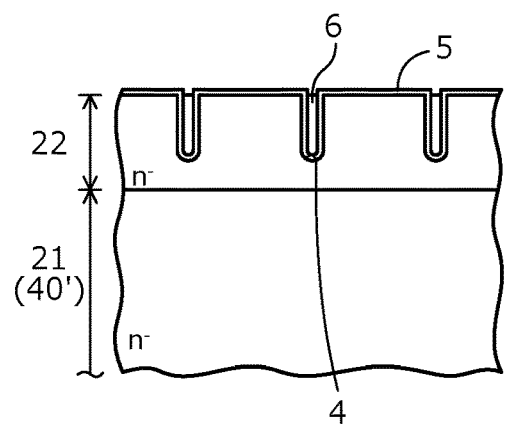
FIG. 15 is an enlarged view of a part of FIG. 8.

Next, as depicted in FIGS. 7 and 14, after the etching mask 51 is removed, along the front surface of the semiconductor substrate 20 and inner walls of the trenches 4, the gate insulating film 5 is formed. Next, a polysilicon (poly-Si) layer (not depicted) is deposited on the front surface of the semiconductor substrate 20 so as to be embedded in the trenches 4. Next, as depicted in FIGS. 8 and 15, the polysilicon layer is etched until the gate insulating film 5 on the front surface of the semiconductor substrate 20 is exposed. A part of the polysilicon layer, on the front surface of the semiconductor substrate 20, is removed by this etching, leaving parts of the polysilicon layer in the trenches 4 as the gate electrodes 6.

Figure 9:
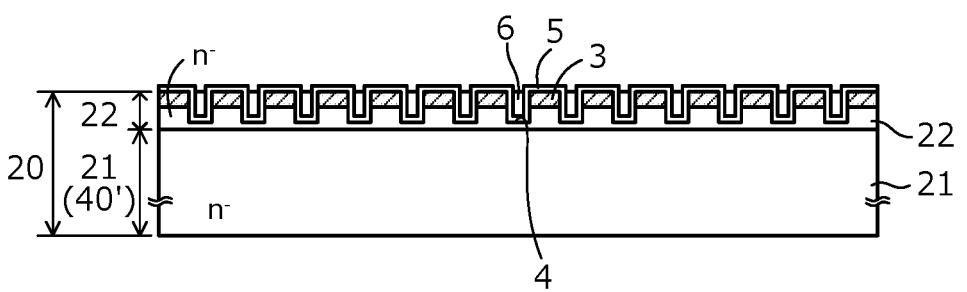
FIG. 9 is a cross-sectional view depicting a state of the structure of the semiconductor device according to the first embodiment during manufacture.
Figure 16:
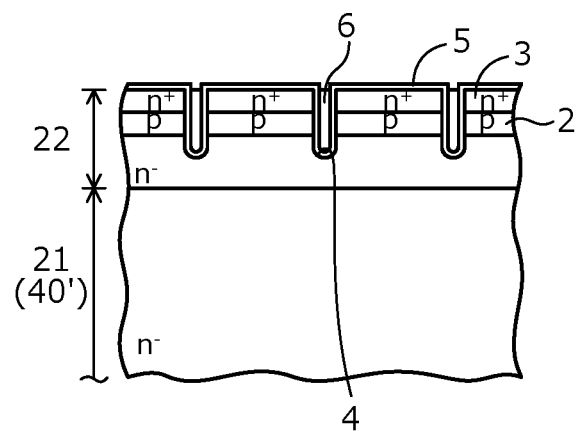
FIG. 16 is an enlarged view of a part of FIG. 9.

Next, as depicted in FIGS. 9 and 16, a second ion implantation is performed over the gate insulating film 5, whereby predetermined diffusion regions such as the p-type base regions (plurality of first semiconductor regions) 2, the n⁺-type emitter regions 3, and the p⁺-type contact regions (not depicted) are formed at the front side of the semiconductor substrate 20, in the active region 71 (step S5: fourth process). These diffusion regions are selectively formed in each of the mesa regions by repeatedly performing, under different conditions, a process that includes photolithography and the second ion implantation as one set. In FIG. 9, the n⁺-type emitter regions 3 are indicated by hatching while the p-type base regions 2 are not depicted (similarly in FIGS. 10 to 12). Further, an activation heat treatment for the impurity dopant implanted by the second ion implantation is performed.

Figure 10:
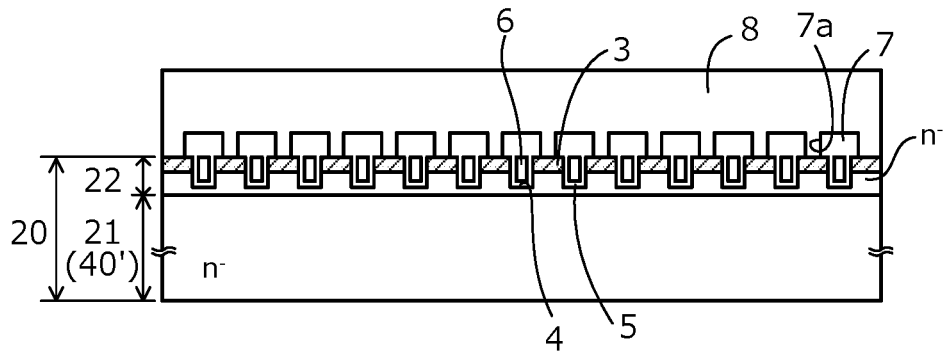
FIG. 10 is a cross-sectional view depicting a state of the structure of the semiconductor device according to the first embodiment during manufacture.
Figure 17:
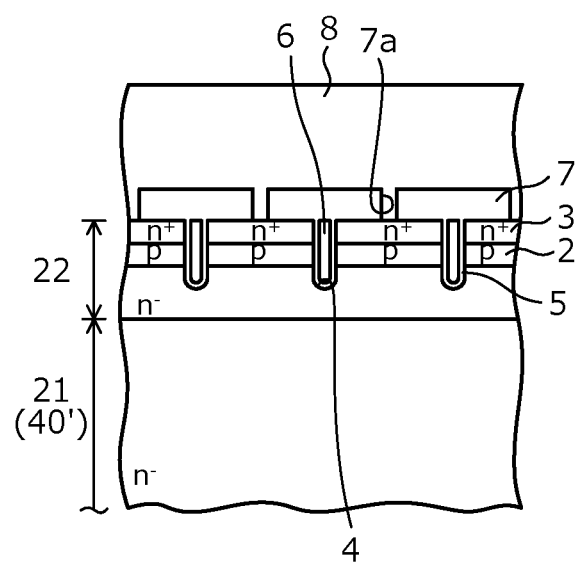
FIG. 17 is an enlarged view of a part of FIG. 10.

Next, as depicted in FIG. 10, the emitter electrode 8 that is a front electrode is formed (step S6: fifth process). In the process at step S6, in particular, as depicted in FIGS. 10 and 17, at an entire area of the front surface of the semiconductor substrate 20, the interlayer insulating film 7 is formed covering the gate electrodes 6. Next, the interlayer insulating film 7 is selectively removed by photolithography and etching, thereby forming the contact holes 7a that expose the n⁺-type emitter regions 3 and the p⁺-type contact regions. Next, the emitter electrode 8 is formed at the front surface of the semiconductor substrate 20, in ohmic contact with the n⁺-type emitter regions 3 and the p⁺-type contact regions via the contact holes 7a.

Figure 11:
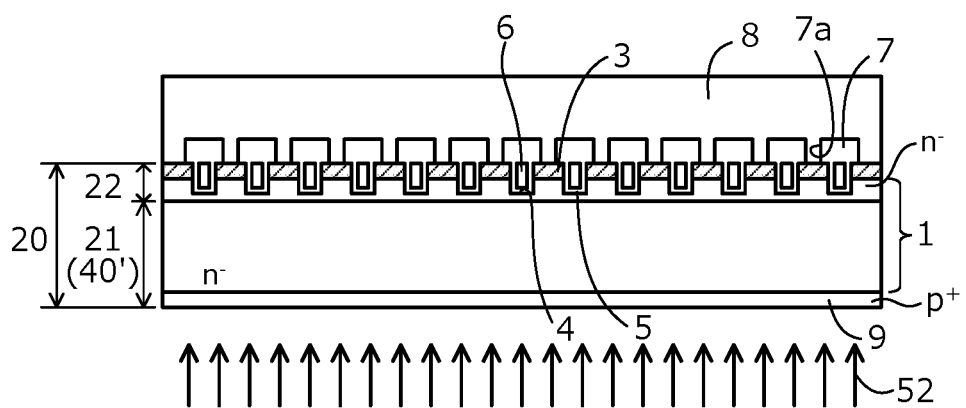
FIG. 11 is a cross-sectional view depicting a state of the structure of the semiconductor device according to the first embodiment during manufacture.

Next, as depicted in FIG. 11, the semiconductor substrate 20 is ground from the back surface (main surface on side having the n⁻-type starting substrate 21), to have a product thickness as the semiconductor device 10 (step S7). Next, predetermined diffusion regions such as the p⁺-type collector region (second semiconductor region) 9 are formed at the ground back surface of the semiconductor substrate 20 by a third ion implantation 52 (step S8: sixth process). The p⁺-type collector region 9 is formed in a surface region of the semiconductor substrate 20, at the ground back surface thereof, by the third ion implantation 52 of a p-type impurity dopant such as, for example, boron (B). Further, an activation heat treatment for the impurity dopant implanted by the third ion implantation 52 is performed.

Figure 12:
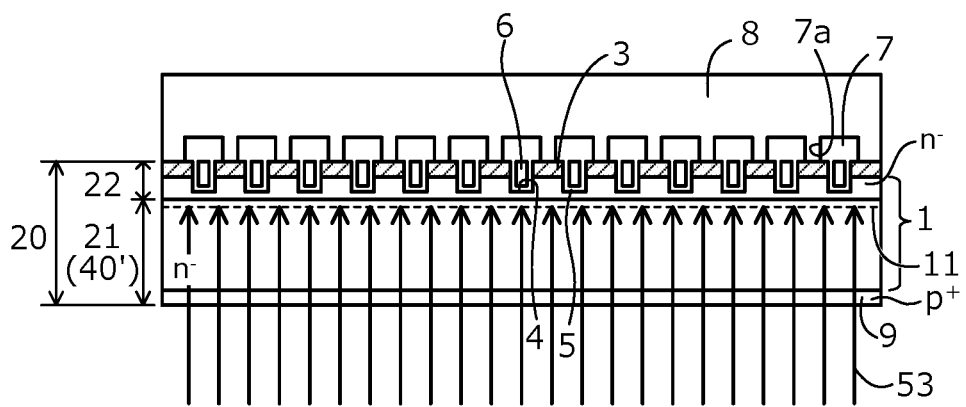
FIG. 12 is a cross-sectional view depicting a state of the structure of the semiconductor device according to the first embodiment during manufacture.
Figure 18:
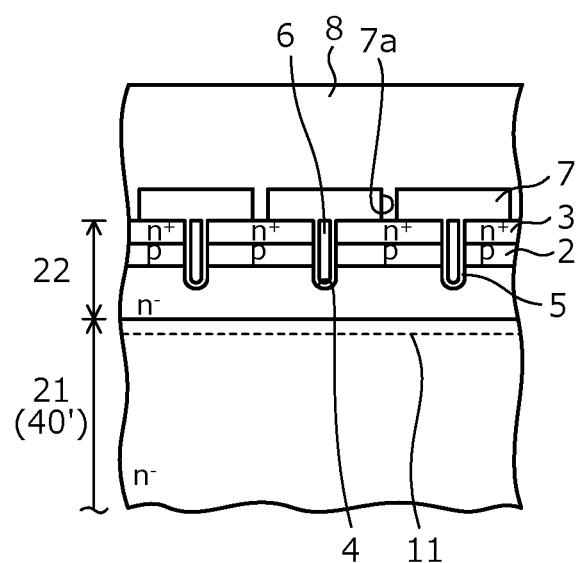
FIG. 18 is an enlarged view of a part of FIG. 12.

Next, as depicted in FIGS. 12 and 18, after the proton implantation 53 to the n⁻-type starting substrate 21 from the ground back surface of the semiconductor substrate 20 (step S9: seventh process), the first heat treatment is performed for about five hours at a temperature of, for example, about 350 degrees C. (step S10: eighth process). Crystal defects such as voids (V) in the n⁻-type starting substrate 21 arise due to the proton implantation 53 and the crystal defects that occur due to the proton implantation 53 and an oxide that contains hydrogen (H) and oxygen (O) present at a site having the crystal defects combine and are subject to donor conversion by the first heat treatment. As a result, a hydrogen donor is introduced into the n⁻-type starting substrate 21 and the total n-type impurity concentration of the n⁻-type starting substrate 21 becomes higher than before the proton implantation 53.

By the processes at steps S9 and S10, the total n-type impurity concentration of the n⁻-type starting substrate 21 is adjusted to be reduced so that the resistivity of the n⁻-type starting substrate 21 is reduced to be a resistivity (the target resistivity of the n⁻-type drift region 1) that is substantially equal to the resistivity of the n⁻-type epitaxial layer 22. After the process (the proton implantation 53) at step S9, a high-temperature (for example, at least 600 degrees C.) heat treatment is not performed. The process at step S10 (first heat treatment) is performed at a low temperature (for example, less than 600 degrees C.) so that defects generated in the n⁻-type starting substrate 21 by the process at step S9 are not recovered. Therefore, after the process at step S9, decrease of the total n-type impurity concentration of the n⁻-type starting substrate 21 may be prevented.

The resistivity of the MCZ wafer 40' is sufficiently large as compared to the target resistivity of the n⁻-type drift region 1 and a ratio of the n-type impurity concentration of the n-type impurity dopant of the n⁻-type starting substrate 21 to the total n-type impurity concentration of the n⁻-type starting substrate 21 is extremely small. Therefore, implantation conditions (for example, dose amount and acceleration energy) of the proton implantation 53 may be conditions that realize the target resistivity of the n⁻-type drift region 1 by the hydrogen donor only, without consideration of the n-type impurity concentration of the n-type impurity dopant of the n⁻-type starting substrate 21. The implantation conditions of the proton implantation 53 may be determined before the start of manufacturing processes, based on measured values of the resistivity of the MCZ wafer 40'.

In the process at step S9, the proton range position 11 of the proton implantation 53 suffices to satisfy the distance d2 (refer to FIG. 1) from the bottoms of the trenches 4 to the proton range position 11 described above and may be at the interface between the n⁻-type starting substrate 21 and the n⁻-type epitaxial layer 22 (the total n-type impurity concentration distribution 33c) (FIG. 19), or may be at a position (the total n-type impurity concentration distribution 33a) slightly apart from the interface between the n⁻-type starting substrate 21 and the n⁻-type epitaxial layer 22, toward the collector (FIG. 20), or may be in the n⁻-type epitaxial layer 22 (the total n-type impurity concentration distribution 33d) (FIG. 21).

Further, in the process at step S9, one or more stages of proton implantation under implantation conditions different from those of the proton implantation 53 may be further performed to form, for example, in the n⁻-type drift region 1, one or more stages of n-type field stop (FS) regions (not depicted). The n-type FS regions are formed at positions deeper from the back surface of the semiconductor substrate 20 than is the p⁺-type collector region 9. When there are plural stages of the n-type FS regions, the plural stages of the n-type FS regions are disposed at differing depths from the back surface of the semiconductor substrate 20. A heat treatment for donor conversion of the defects generated by the proton implantation for forming the n-type FS regions may be performed by the first heat treatment at step S10.

Next, by helium (He) implantation from the back surface of the semiconductor substrate 20 to the n⁻-type drift region 1 (step S11) and a second heat treatment (step S12), helium that becomes a lifetime killer is introduced into the n⁻-type drift region 1 and minority carrier lifetime in the n⁻-type drift region 1 is adjusted. Next, at the back surface of the semiconductor substrate 20, the contact electrode 12 is formed, as a back electrode, in ohmic contact with the p⁺-type collector region 9 (step S13: ninth process). Next, the semiconductor wafer (the semiconductor substrate 20) is diced (cut) into individual chips (step S14), whereby the IGBT depicted in FIG. 1 is completed.

As described above, according to the first embodiment, the semiconductor substrate is configured by the n⁻-type starting substrate that is a MCZ wafer that is an epitaxially grown base wafer, and the n⁻-type epitaxial layer having the n-type impurity concentration for the target resistivity of the type drift region and formed by epitaxial growth on the n⁻-type starting substrate. A semiconductor device such as an IGBT is fabricated using this semiconductor substrate. The n⁻-type starting substrate and the n⁻-type epitaxial layer function as the n⁻-type drift region of the semiconductor device.

The standard for the resistivity of the MCZ wafer that becomes the type starting substrate is set more widely than that conventionally, based on a resistivity greater than the target resistivity of the n⁻-type drift region. As a result, the part of the MCZ ingot outside the standard for the resistivity of the MCZ wafer may be smaller than that conventionally, or may be eliminated. Therefore, the number of MCZ wafers sliced from a single MCZ ingot may be increased as compared to a conventional case, enabling the unit price of the MCZ wafer to be reduced.

The MCZ wafer is used as the n⁻-type starting substrate and a hydrogen donor is introduced into the MCZ wafer by proton implantation. The hydrogen-donor introduced part formed by the proton implantation is a region having uniform resistivity. Therefore, the proton implantation amount to the n⁻-type starting substrate is adjusted, whereby the resistivity of the n⁻-type starting substrate is adjusted to be substantially the same resistivity as the resistivity (the target resistivity of the n⁻-type drift region) of the n⁻-type epitaxial layer. As a result, the resistivity of the semiconductor substrate that is the n⁻-type drift region is uniform, thereby enabling predetermined characteristics and a predetermined breakdown voltage to be stably obtained.

Further, according to the first embodiment, the proton range position is positioned to be separate from the bottoms of the trenches, toward the collector, whereby damage due to the proton implantation does not occur in the gate insulating film. Therefore, when the resistivity of the n⁻-type starting substrate is adjusted by the proton implantation, degradation of gate characteristics may be prevented. Further, the proton range position is positioned to be separate from the bottoms of the trenches, whereby a predetermined breakdown voltage may be ensured. Accordingly, predetermined characteristics and the predetermined breakdown voltage may be stably obtained.

Figure 22:
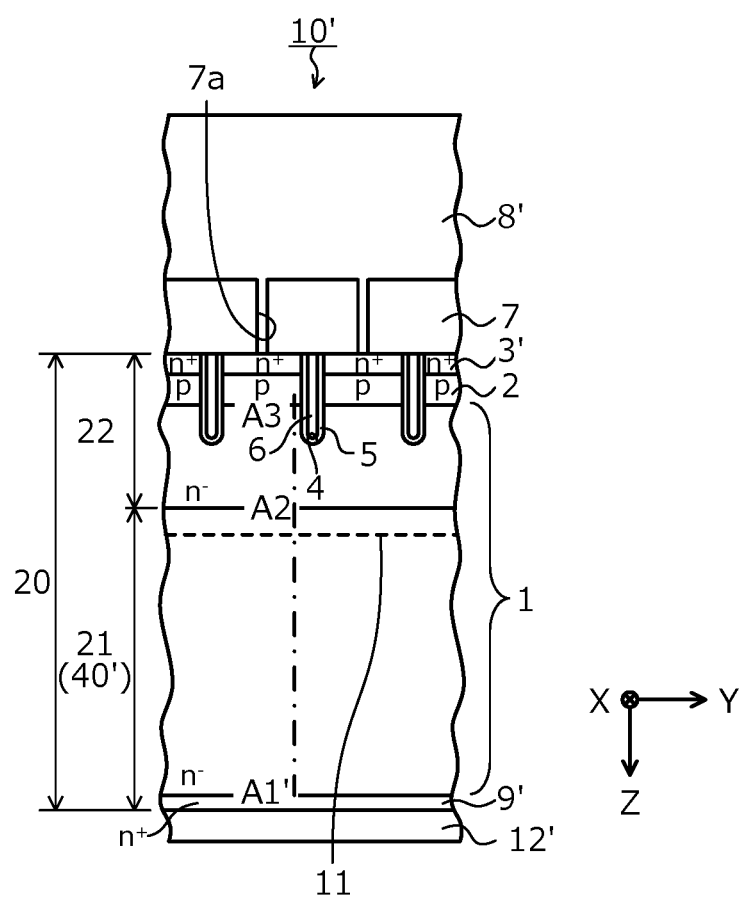
FIG. 22 is a cross-sectional view depicting an example of a structure of a semiconductor device according to a second embodiment.
Figure 23:
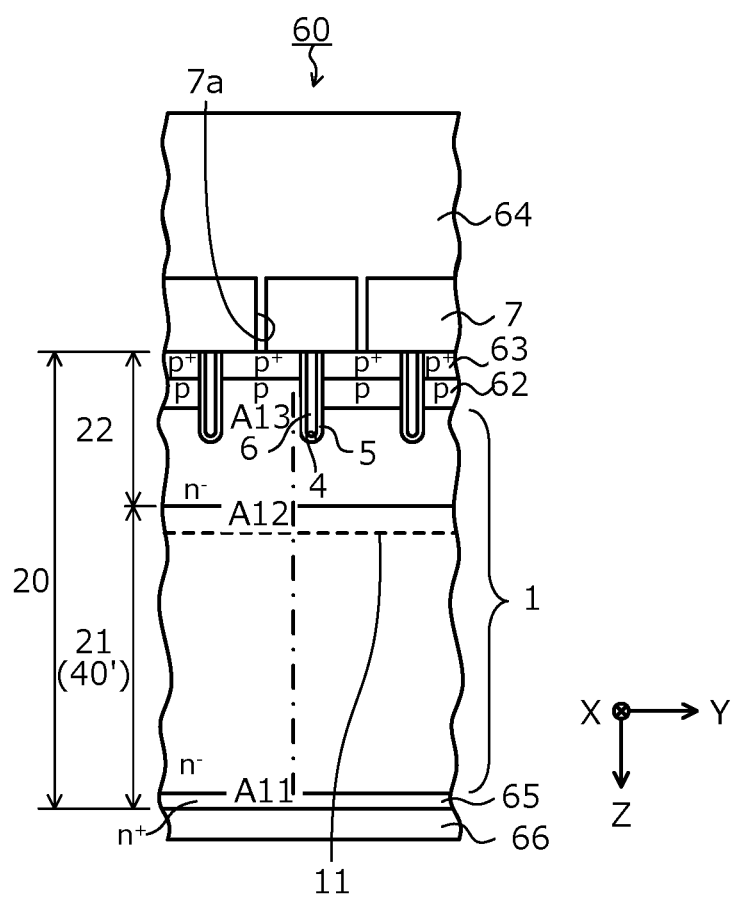
FIG. 23 is a cross-sectional view depicting an example of the structure of the semiconductor device according to the second embodiment.

Next, a structure of a semiconductor device according to a second embodiment will be described. FIGS. 22 and 23 are cross-sectional views depicting examples of the structure of the semiconductor device according to the second embodiment. In FIG. 22, along cutting line A1-A2-A3 are depth positions of the n⁻-type drift region 1 and reference characters A1', A2, and A3 are depth positions equal to those of reference characters A1, A2, and A3, respectively, in FIG. 1. In FIG. 23, along cutting line A11-A12-A13 are depth positions of the n⁻-type drift region 1 and reference characters A11, A12, and A13 are depth positions equal to those of reference characters A1, A2, and A3, respectively, in FIG. 1.

Semiconductor devices 10', 60 according to the second embodiment depicted in FIGS. 22 and 23 are, respectively, a metal oxide semiconductor field effect transistor (MOSFET) that includes an insulated gate formed by a three-layer structure including a metal, an oxide film and a semiconductor, and a diode, to which the semiconductor device 10 according to the first embodiment (refer to FIG. 1) is applied.

In particular, the semiconductor device 10' according to the second embodiment depicted in FIG. 22 includes n⁺-type source regions 3', an n⁺-type drain region 9', a source electrode 8', and a drain electrode 12' instead of the n⁺-type emitter regions 3, the p⁺-type collector region 9, the emitter electrode 8, and the contact electrode 12 of the semiconductor device 10 according to the first embodiment depicted in FIG. 1 and has the n⁻-type drift region 1 of the n-type impurity concentration distributions 31 to 33 equal to those of the first embodiment.

A method of manufacturing the semiconductor device 10' according to the second embodiment depicted in FIG. 22 suffices to respectively form the n⁺-type source regions 3', the source electrode 8', the n⁺-type drain region 9', and the drain electrode 12' during the processes at steps S5, S6, S8, and S13 in the method of manufacturing the semiconductor device 10 according to the first embodiment depicted in FIG. 1. In the processes at steps S5, S6, and S13, the same materials as those of the first embodiment may be used. In the process at step S8, an n-type impurity dopant is implanted by the third ion implantation instead of a p-type impurity dopant.

The semiconductor device 60 according to the second embodiment depicted in FIG. 23 includes p-type anode regions 62, p⁺-type anode collector regions 63, an n⁺-type cathode region 65, an anode electrode 64, and a cathode electrode 66 instead of the p-type base regions 2, the n⁺-type emitter regions 3, the p⁺-type collector region 9, the emitter electrode 8, and the contact electrode 12 of the semiconductor device 10 according to the first embodiment depicted in FIG. 1 and has the n⁻-type drift region 1 of the n-type impurity concentration distributions 31 to 33 equal to those of the first embodiment.

A method of manufacturing the semiconductor device 60 according to the second embodiment depicted in FIG. 23 suffices to respectively form the p-type anode regions 62 and the p⁺-type anode collector regions 63 during the process at step S5, and to form the anode electrode 64, the n⁺-type cathode region 65, and the cathode electrode 66 during the processes at steps S6, S8, and S13 of the method of manufacturing the semiconductor device 10 according to the first embodiment depicted in FIG. 1.

In the process at step S5, the impurity dopant of the regions (the p-type anode regions 62 and the p⁺-type anode collector regions 63) formed by the third ion implantation suffices to be a p-type impurity dopant. In the processes at steps S6 and S13, the same materials as those of the first embodiment may be used. In the process at step S8, an n-type impurity dopant is implanted by the third ion implantation instead of a p-type impurity dopant.

The semiconductor device 60 (diode) according to the second embodiment depicted in FIG. 23 may be disposed on the same semiconductor substrate 20 as the semiconductor device 10 according to the first embodiment depicted in FIG. 1 (IGBT) and may be connected in antiparallel to the semiconductor device 10 according to the first embodiment depicted in FIG. 1 and configure a reverse conducting IGBT (RC-IGBT).

As described above, according to the second embodiment, even when the configuration of the n⁻-type drift region of the first embodiment is applied to a MOSFET or a diode, effects similar to those of the first embodiment may be obtained.

Figure 24:
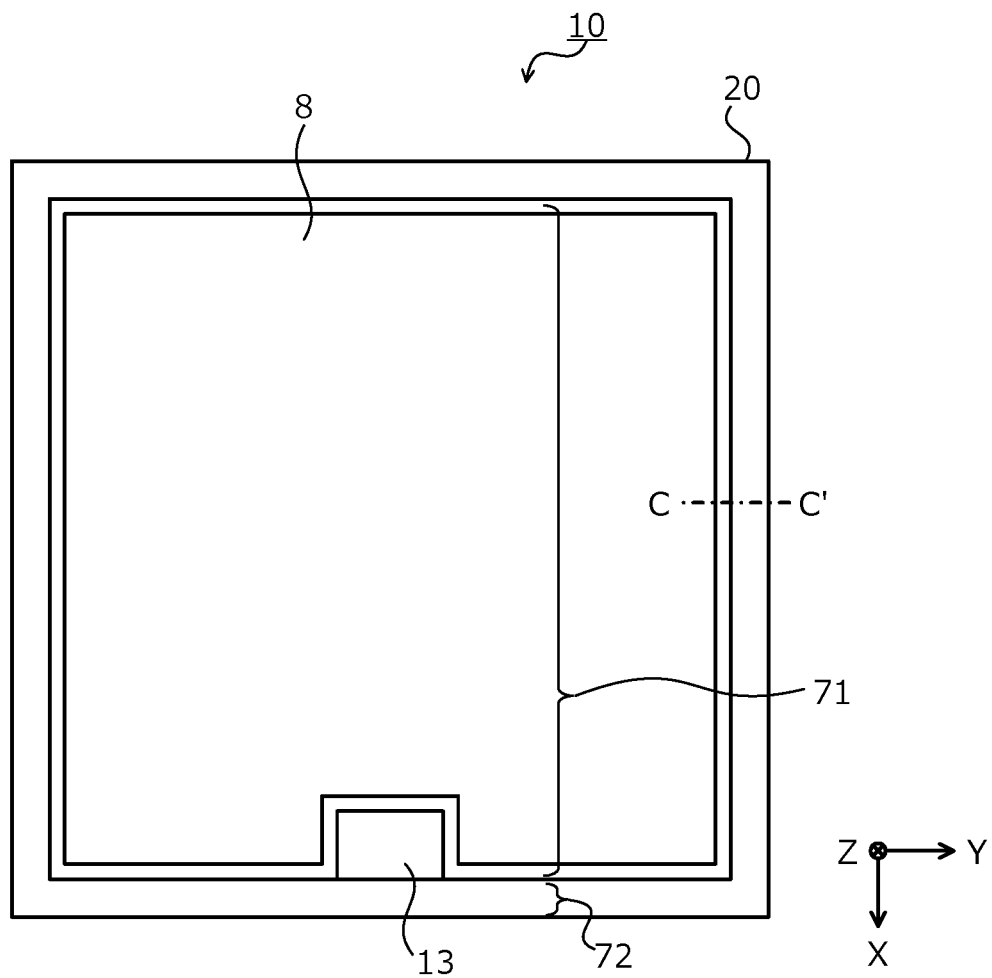
FIG. 24 is a plan view of a layout when a semiconductor device according to a third embodiment is viewed from the front surface of the semiconductor substrate.
Figure 25:
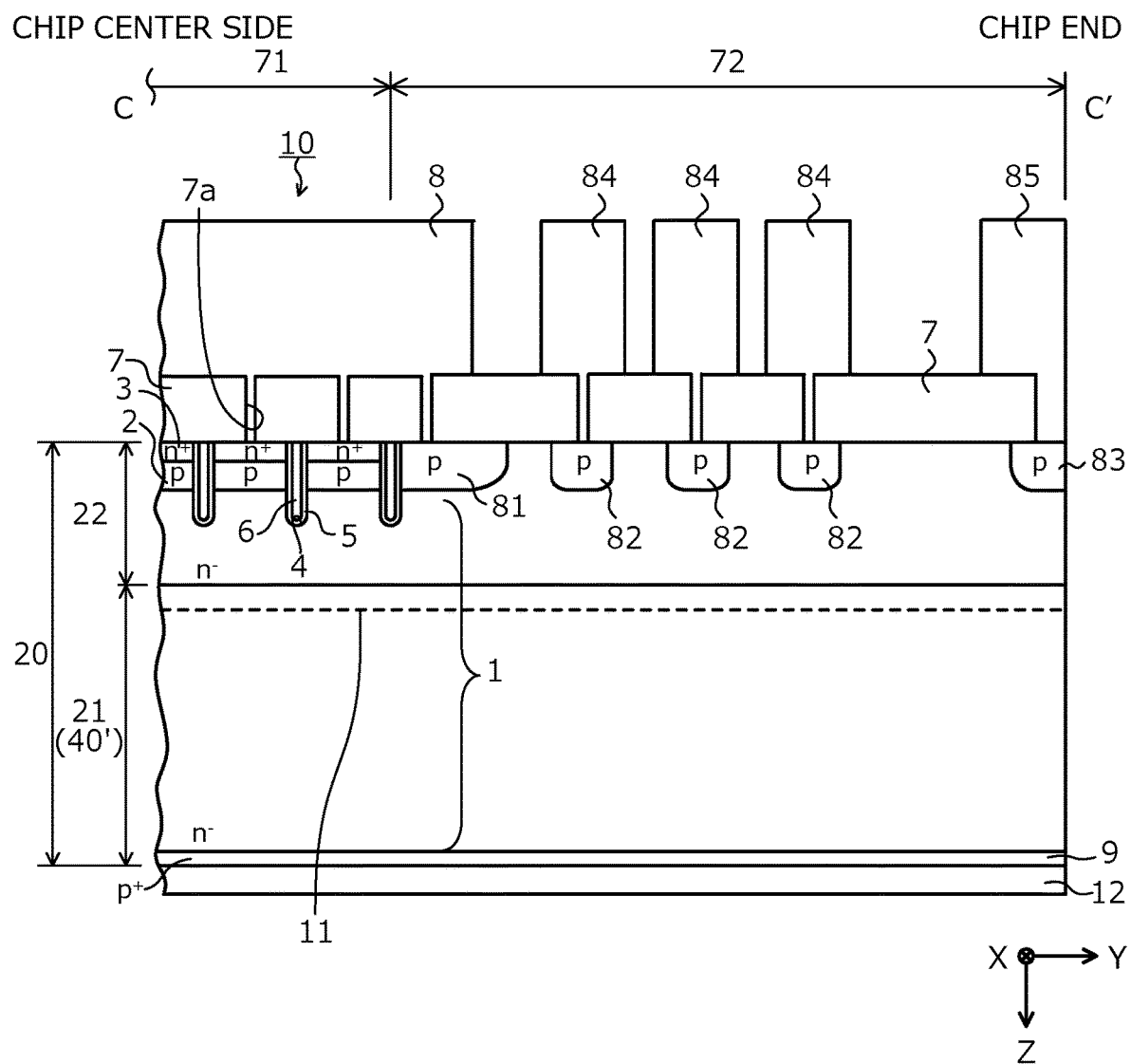
FIG. 25 is a cross-sectional view of an example of the structure along cutting line C-C' in FIG. 24.
Figure 26:
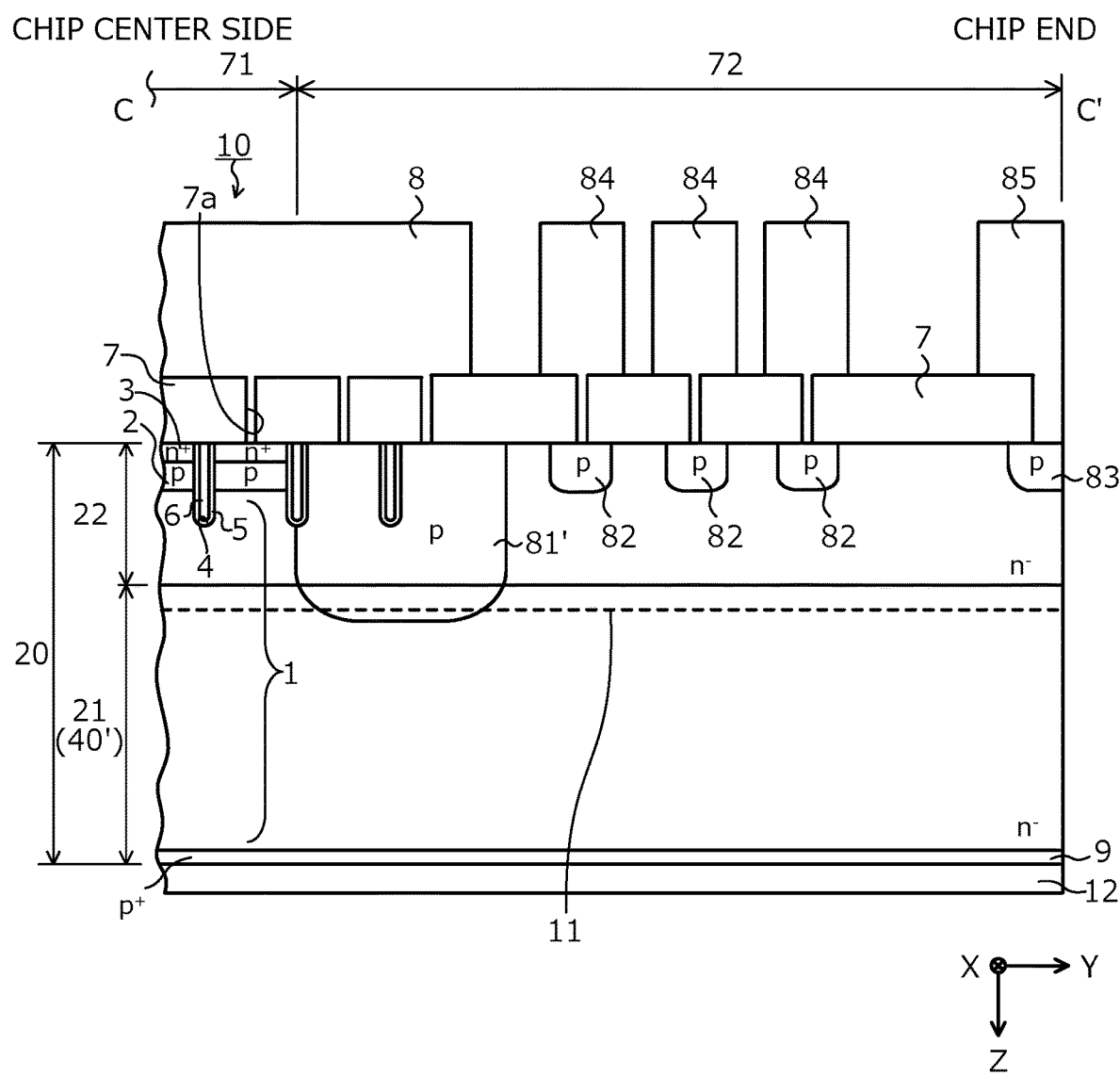
FIG. 26 is a cross-sectional view of an example of the structure along cutting line C-C' in FIG. 24.
Figure 27:
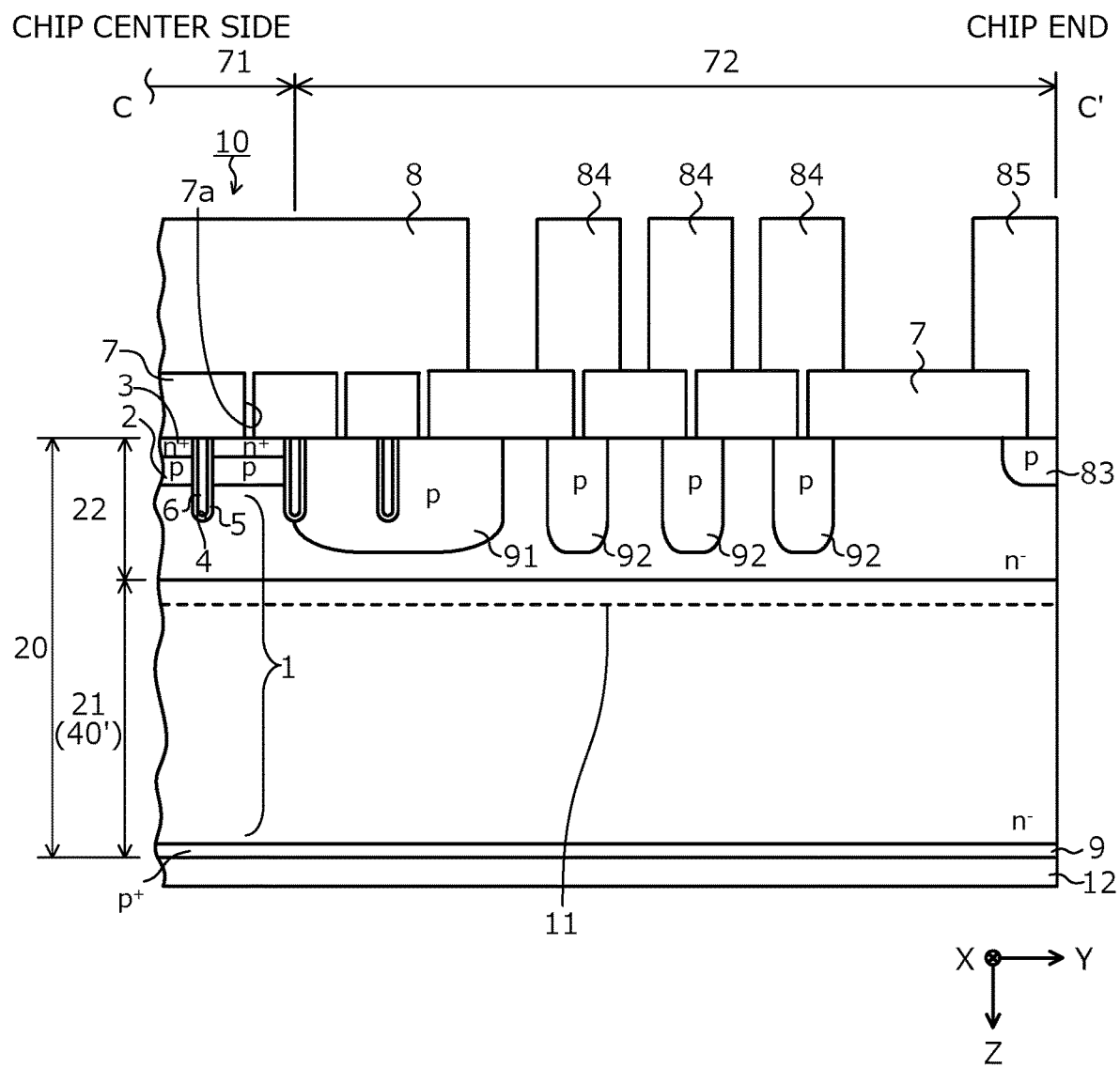
FIG. 27 is a cross-sectional view of an example of the structure along cutting line C-C' in FIG. 24.

Next, as a semiconductor device according to a third embodiment, a structure of the edge termination region 72 of the semiconductor device 10 according to the first embodiment (refer to FIG. 1) will be described. FIG. 24 is a plan view of a layout when the semiconductor device according to the third embodiment is viewed from the front surface of the semiconductor substrate. FIGS. 25, 26, and 27 are cross-sectional views of examples of the structure along cutting line C-C' in FIG. 24.

The semiconductor device according to the third embodiment depicted in FIGS. 24 and 25 includes the active region 71 and the edge termination region 72 in the semiconductor substrate 20. The n-type impurity concentration distributions 31 to 33 (refer to FIG. 1) of the n⁻-type starting substrate 21 and the n⁻-type epitaxial layer 22 configuring the semiconductor substrate 20 are in the same states along a direction parallel to the main surface of the semiconductor substrate 20.

The active region 71 is disposed at substantially a center (chip center) of the semiconductor substrate 20 in a substantially rectangular planar shape. The edge termination region 72 is a region between the active region 71 and an end (chip end) of the semiconductor substrate 20, and surrounds a periphery of the active region 71. The emitter electrode 8 is disposed in substantially an entire area of the active region 71. Reference number 13 is a gate pad.

A border between the active region 71 and the edge termination region 72, along the first direction X that is parallel to the front surface of the semiconductor substrate 20 and along which the trenches 4 extend, is outer ends of outermost n⁺-type emitter regions 3 disposed outermost (closest to ends of the semiconductor substrate 20) among the n⁺-type emitter regions 3, the outer ends of the outermost n⁺-type emitter regions 3 being ends closest to said ends of the semiconductor substrate 20, and along the second direction Y that is parallel to the front surface of the semiconductor substrate 20 and orthogonal to the first direction X, the border between the active region 71 and the edge termination region 72 is centers of outermost trenches disposed closest to ends of the semiconductor substrate 20, among the trenches 4.

In the active region 71, similarly to the semiconductor device 10 according to the first embodiment (refer to FIG. 1), unit cells of the IGBT are disposed. In the edge termination region 72, for example, voltage withstanding structures such as the p-type well region (second-conductivity-type well region) 81, the FLRs 82, field plates (FP) 84, the channel stopper 83, and a channel stopper electrode 85 are disposed.

Further, in the edge termination region 72, similarly to the active region 71, the hydrogen donor is introduced into the n⁻-type starting substrate 21 and the total n-type impurity concentration of the n⁻-type starting substrate 21 is substantially equal to the n-type impurity concentration of the n⁻-type epitaxial layer 22. As a result, the resistivity of the n⁻-type starting substrate 21 increases up to the target resistivity of the n⁻-type drift region 1.

The p-type well region 81, the FLRs 82, and the channel stopper 83 are disposed separate from one another in the n⁻-type epitaxial layer 22, at surface regions of the front surface (main surface on side of the semiconductor substrate 20 having the n⁻-type epitaxial layer 22) of the semiconductor substrate 20. The p-type well region 81, the FLRs 82, and the channel stopper 83 are exposed at the front surface of the semiconductor substrate 20.

The p-type well region 81 is provided in the edge termination region 72 and surrounds a periphery of the active region 71. The p-type well region 81 extends to the outermost trenches that are outermost along the second direction Y, among the trenches 4 and the p-type well region 81 is exposed at outer sidewalls of the outermost trenches, the outer sidewalls being those closest to ends of the semiconductor substrate 2. The p-type well region 81 may be exposed spanning from the outer sidewalls of the outermost trenches to the bottoms thereof.

The p-type well region 81 has a depth that is at least the depth of the p-type base regions 2. The depth of the p-type well region 81, for example, may be deeper than the depth of the trenches 4. The depth of the p-type well region 81 may be less than the thickness of the n⁻-type epitaxial layer 22 and an end of the p-type well region 81 closest to the collector terminates in the n⁻-type epitaxial layer 22 (FIG. 25). The channel stopper 83 has a conductivity type that may be a p-type or an n-type.

Alternatively, a p-type well region (second-conductivity-type well region) 81' may have a depth that is at least the thickness of the n⁻-type epitaxial layer 22 (FIG. 26). In this case, an end of the p-type well region 81' closest to the collector terminates in the n⁻-type starting substrate 21. Protons may be introduced into the p-type well region 81' and the proton range position 11 may be in the p-type well region 81'.

Alternatively, when a p-type well region 91 has a depth that is less than the thickness of the n⁻-type epitaxial layer 22, the depth of the p-type well region 91 and a depth of FLRs 92 may be substantially equal (FIG. 27). The p-type well regions 81', 91 may surround the outermost trench gates (the outermost trenches 4, the gate insulating film 5, and the gate electrodes 6) entirely.

The semiconductor device according to the third embodiment depicted in FIG. 26, other than the depth of the p-type well region 81' being different, has a same configuration as that of the semiconductor device according to the third embodiment depicted in FIG. 25. The semiconductor device according to the third embodiment depicted in FIG. 27, other than configuration of the p-type well region 91 and the FLRs 92, has the same configuration as that of the semiconductor device according to the third embodiment depicted in FIG. 26.

When the p-type well regions 81', 91 surround the outermost trench gates entirely, the border between the active region 71 and the edge termination region 72 is the outer ends of the outermost n⁺-type emitter region along the first direction X among the n⁺-type emitter regions 3 and is the center of each trench 4 that is next to the outermost trenches along the second direction Y among the trenches 4 (each trench 4 that is one trench closer to the center of the semiconductor substrate 20 than the outermost trenches 4).

The FLRs 82, 92 are p-type regions disposed separate from the p-type well region 81, 81', 91 and closer to the ends of the semiconductor substrate 20 than are the p-type well regions 81, 81', 91. The FLRs 82, 92 are disposed in plural, concentrically surrounding a periphery of the p-type well regions 81, 81', 91, separate from one another. Depths of the FLRs 82, 92, for example, may be substantially equal to the depth of the p-type base regions 2. The depths being substantially equal depths means substantially equal depths in a range that includes manufacturing tolerance (for example, less than 20%) for process variation.

The channel stopper 83 is an n-type region disposed separate from the FLRs 82, 92, closer to the ends of the semiconductor substrate 20 than are the FLRs 82, 92, and surrounding, in a ring-shape, a periphery of the FLRs 82, 92 closest to the ends of the semiconductor substrate 20. The channel stopper 83 is exposed at the ends of the semiconductor substrate 20. The channel stopper 83 has a depth that may be, for example, substantially equal to the depth of the p-type base regions 2.

In the edge termination region 72, the front surface of the semiconductor substrate 20 is covered by the interlayer insulating film 7 that extends from the active region 71. In the interlayer insulating film 7 of the edge termination region 72, the plural contact holes 7a that respectively expose the p-type well region 81, 81', 91, the plural FLRs 82, 92, and the channel stopper 83 are provided.

On the interlayer insulating film 7 of the edge termination region 72, the emitter electrode 8 extends from the active region 71. The emitter electrode 8 faces the p-type well regions 81, 81', 91 in the depth direction Z, across the interlayer insulating film 7, and is electrically connected to the p-type well region 81, 81', 91 via the contact holes 7a. Ends of the emitter electrode 8 terminate closer to the center of the semiconductor substrate 20 than do outer ends of the p-type well regions 81, 81', 91, closest to the ends of the semiconductor substrate 20.

Further, on the interlayer insulating film 7 of the edge termination region 72, closer to the ends of the semiconductor substrate 20 than is the emitter electrode 8, FPs 84 of a number equal to the number of the FLRs 82, 92 are provided separate from the emitter electrode 8. The plural FPs 84 each faces a different FLR of the FLRs 82, 92 in the depth direction Z, across the interlayer insulating film 7 and are electrically connected, via the contact holes 7a, to the FLRs 82, 92 facing thereto in the depth direction Z.

Further, on the interlayer insulating film 7 of the edge termination region 72, the channel stopper electrode 85 is provided separate from the FPs 84, closer to the ends of the semiconductor substrate 20 than is an outermost FP that is closest to the ends of the semiconductor substrate 20 among the FPs 84. The channel stopper electrode 85 faces the channel stopper 83 in the depth direction Z, across the interlayer insulating film 7, and is electrically connected to the channel stopper 83 via the contact holes 7a.

The configuration of the edge termination region 72 described above is further applicable to the semiconductor devices 10', 60 according to the second embodiment (refer to FIGS. 22 and 23).

As described above, according to the third embodiment, effects similar to those of the first embodiment may be obtained. Further, according to the third embodiment, even when the configuration of the n⁻-type drift region in the active region is extended into the edge termination region, element characteristics similar to those of the first embodiment may be maintained. Configuration of the n⁻-type drift region needs not be modified in the active region and the edge termination region, thereby enabling manufacturing processes to be simplified.

In the foregoing, without limitation to the embodiments described above, various modifications within a range not departing from the spirit of the invention are possible. For example, in the embodiments described above, dimensions and impurity concentrations of parts, etc. are variously set according to necessary specifications. Further, instead of the phosphorus-doped n⁻-type MCZ ingot, a p⁻-type MCZ ingot introduced with a low dose amount of a p-type impurity dopant such as boron, or a non-doped MCZ ingot may be used.

According to the invention described above, the standard for the resistivity of the MCZ wafer that becomes the first-conductivity-type substrate may be set more widely than conventionally based on a resistivity that is greater than the target resistivity of the first-conductivity-type drift region. As a result, the part of MCZ ingot outside the standard for the resistivity of the MCZ wafer may be made smaller than conventionally or may be eliminated. Therefore, the number of MCZ wafers sliced from a single MCZ ingot may be increased as compared to a conventional case, thereby enabling the unit price of the MCZ wafer to be reduced.

The MCZ wafer is used as the first-conductivity-type substrate and a hydrogen donor is introduced into the MCZ wafer by proton implantation. The hydrogen-donor introduced part formed by the proton implantation is a region in which the resistivity is uniform. Therefore, the proton implantation amount to the first-conductivity-type substrate is adjusted to adjust the resistivity of the first-conductivity-type substrate to be the target resistivity of the first-conductivity-type drift region that is substantially equal to that of the first-conductivity-type epitaxial layer. As a result, the resistivity of the semiconductor substrate that forms the first-conductivity-type drift region becomes substantially uniform, enabling predetermined characteristics and a predetermined breakdown voltage to be stably obtained.

According to the semiconductor device and the method of manufacturing a semiconductor device an effect is achieved in that a semiconductor device using a low-cost n-type semiconductor substrate having substantially uniform resistivity and a method of manufacturing the semiconductor device are provided.

As described above, the semiconductor device and the method of manufacturing a semiconductor device according to the present invention are useful for power semiconductor devices used in power conversion equipment or power source devices such as in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate having a first main surface and a second main surface, the semiconductor substrate including a first-conductivity-type substrate, and a first-conductivity-type epitaxial layer provided on the first-conductivity-type substrate, the first-conductivity-type epitaxial layer having first and second surfaces opposite to each other, the first surface being in contact with the first-conductivity-type substrate and the second surface being the first main surface of the semiconductor substrate, the first-conductivity-type substrate having third and fourth surfaces opposite to each other, the third surface being in contact with the first-conductivity-type epitaxial layer and the fourth surface being the second main surface of the semiconductor substrate;
    a plurality of trenches having sidewalls and reaching a predetermined depth from the first main surface of the semiconductor substrate and terminating in the first-conductivity-type epitaxial layer;

a plurality of gate electrodes respectively provided in the plurality of trenches via a gate insulating film;

a plurality of first semiconductor regions of a second conductivity type, provided in surface regions of the semiconductor substrate at the first main surface thereof and exposed at the sidewalls of the plurality of trenches;

a second semiconductor region provided at a surface region of the semiconductor substrate at the second main surface thereof;

a first electrode electrically connected to the plurality of first semiconductor regions; and a second electrode electrically connected to the second semiconductor region, wherein the semiconductor substrate includes a hydrogen-donor introduced part formed by a hydrogen donor introduced from the second main surface, a concentration of the hydrogen donor in the hydrogen-donor introduced part being greatest at a first depth position, which is a position in a depth direction separate from bottoms of the plurality of trenches by a distance that is at least two times of the depth of the plurality of trenches, the first depth position being closer to the second main surface than are the bottoms of the plurality of trenches, the first-conductivity-type substrate and the first-conductivity-type epitaxial layer each have a first-conductivity-type impurity dopant, an impurity concentration of the first-conductivity-type impurity dopant of the first-conductivity-type substrate being lower than an impurity concentration of the first-conductivity-type impurity dopant of the first-conductivity-type epitaxial layer, and a difference between a first resistivity, which is a resistivity corresponding to a total impurity concentration of the first-conductivity-type impurity dopant and the hydrogen donor of the first-conductivity-type substrate, and a second resistivity, which is a resistivity corresponding to the impurity concentration of the first-conductivity-type impurity dopant of the first-conductivity-type epitaxial layer, is at most 20%.

2. The semiconductor device according to claim 1, wherein
the hydrogen-donor introduced part is provided spanning the first-conductivity-type substrate and the first-conductivity-type epitaxial layer.

3. The semiconductor device according to claim 1, wherein
the hydrogen-donor introduced part is separate from the first-conductivity-type epitaxial layer,
the total impurity concentration of the first-conductivity-type substrate has a predetermined impurity concentration at a second depth position, and
exhibits a Gaussian distribution and progressively decreases from the first depth position across the semiconductor substrate toward the first main surface and toward the second depth position, and
exhibits a uniform impurity concentration distribution, or an impurity concentration distribution in which the total impurity concentration gradually decreases at a predetermined slope, from the second depth position across the semiconductor substrate toward the second main surface, and
a distance between an end of the hydrogen-donor introduced part closest to the first main surface and an end of the first-conductivity-type epitaxial layer closest to the second main surface is at most a full width at half maximum (FWHM) of the Gaussian distribution or at most one half of a thickness of the first-conductivity-type epitaxial layer.

4. The semiconductor device according to claim 1, further comprising:
an active region in which the plurality of gate electrodes is provided;
a termination region surrounding a periphery of the active region; and
a second-conductivity-type well region provided in the termination region and surrounding the periphery of the active region, the second-conductivity-type well region being exposed at the sidewalls of outermost ones of the plurality of trenches, wherein
the second-conductivity-type well region penetrates the first-conductivity-type substrate from the first main surface of the semiconductor substrate.

5. The semiconductor device according to claim 4, wherein
the hydrogen-donor introduced part is provided across the second-conductivity-type well region.

6. The semiconductor device according to claim 1, wherein
the first-conductivity-type substrate is a silicon substrate sliced from an ingot formed by a magnetic Czochralski method.

7. A method of manufacturing a semiconductor device, the method comprising:
preparing a first-conductivity-type substrate sliced from an ingot formed by a magnetic Czochralski method, depositing a first-conductivity-type epitaxial layer on the first-conductivity-type substrate, the first-conductivity-type epitaxial layer having an impurity concentration of a first-conductivity-type impurity dopant higher than an impurity concentration of the first-conductivity-type impurity dopant in the first-conductivity-type substrate;

forming a plurality of trenches reaching a predetermined depth from an exposed surface of the first-conductivity-type epitaxial layer to terminate in the first-conductivity-type epitaxial layer;

forming a plurality of gate electrodes in the plurality of trenches, respectively, via a gate insulating film;

forming a plurality of first semiconductor regions of a second conductivity type at surface regions of the exposed surface of the first-conductivity-type epitaxial layer through a first ion-implantation, the plurality of first semiconductor regions being exposed at sidewalls of the plurality of trenches;

forming a first electrode electrically connected to the plurality of first semiconductor regions;

forming a second semiconductor region at a surface region of an exposed surface of the first-conductivity-type substrate through a second ion-implantation;

forming crystal defects in the first-conductivity-type substrate through an implantation of protons from the exposed surface of the first-conductivity-type substrate;

introducing a hydrogen donor into the first-conductivity-type substrate by converting the crystal defects into donors through a heat treatment; and forming a second electrode electrically connected to the second semiconductor region, wherein
during the implantation of the protons, a depth position of a range of the protons, corresponding to where a concentration of the hydrogen donor is to be greatest, is a position in a depth direction separate from bottoms of the plurality of trenches by a distance that is at least two times of the depth of the plurality of trenches, the depth position being closer to the exposed surface of the first-conductivity-type substrate than are the bottoms of the plurality of trenches, the first-conductivity-type substrate and the first-conductivity-type epitaxial layer each have the first-conductivity-type impurity dopant when the hydrogen donor is introduced, and a difference between a first resistivity, which is a resistivity corresponding to a total impurity concentration of the first-conductivity-type impurity dopant and the hydrogen donor of the first-conductivity-type substrate, and a second resistivity, which is a resistivity corresponding to the impurity concentration of the first-conductivity-type impurity dopant of the first-conductivity-type epitaxial layer, is at most 20%.

8. The method according to claim 7, wherein during the implantation of the protons, the depth position is at an interface between the first-conductivity-type substrate and the first-conductivity-type epitaxial layer, or is in the first-conductivity-type epitaxial layer.

\* \* \* \* \*